United States Patent
Gustafson

(10) Patent No.: US 10,431,508 B2
(45) Date of Patent: Oct. 1, 2019

(54) METHODS AND SYSTEMS TO IMPROVE PRINTED ELECTRICAL COMPONENTS AND FOR INTEGRATION IN CIRCUITS

(71) Applicant: VQ RESEARCH, INC., Palo Alto, CA (US)

(72) Inventor: John L. Gustafson, Santa Clara, CA (US)

(73) Assignee: VQ RESEARCH, INC., Palo Alto, CA (US)

( * ) Notice: Subject to any disclaimer, the term of this patent is extended or adjusted under 35 U.S.C. 154(b) by 30 days.

(21) Appl. No.: 15/376,729

(22) Filed: Dec. 13, 2016

(65) Prior Publication Data

US 2017/0092556 A1     Mar. 30, 2017

Related U.S. Application Data

(63) Continuation-in-part of application No. 15/212,297, filed on Jul. 18, 2016, now Pat. No. 10,128,047, and
(Continued)

(51) Int. Cl.
*H01L 23/055* (2006.01)
*H01L 23/15* (2006.01)
(Continued)

(52) U.S. Cl.
CPC ........ *H01L 23/055* (2013.01); *G06F 17/5072* (2013.01); *G06F 17/5081* (2013.01); *H01C 7/18* (2013.01); *H01F 27/24* (2013.01); *H01F 27/2804* (2013.01); *H01G 4/005* (2013.01); *H01G 4/012* (2013.01); *H01G 4/232* (2013.01); *H01G 4/30* (2013.01); *H01L 21/4807* (2013.01); *H01L 21/4846* (2013.01);
(Continued)

(58) Field of Classification Search
USPC .................................................. 361/760, 761
See application file for complete search history.

(56) References Cited

U.S. PATENT DOCUMENTS 2,816,054 A    12/1957   Howden
3,115,581 A    12/1963   Kilby
(Continued)

*Primary Examiner* — Andargie M Aychillhum
(74) *Attorney, Agent, or Firm* — Ricky Lam

(57) ABSTRACT

Methods and systems to improve printed electrical components and for integration in circuits are disclosed. Passive components, e.g., capacitors, resistors and inductors, can be printed directly into a solid ceramic block using additive manufacturing. A grounded conductive plane or a conductive cage may be placed between adjacent electrical components, or around each component, to minimize unwanted parasitic effects in the circuits, such as, e.g., parasitic capacitance or parasitic inductance. Resistors may be printed in non-traditional shapes, for example, S-shape, smooth S-shape, U-shape, V-shape, Z-shape, zigzag-shape, and any other acceptable alternative configurations. The flexibility in shapes and sizes of the printed resistors allows optimal space usage of the ceramic block. The present invention also discloses an electrical component comprising combined predetermined values of capacitance, resistance and inductance. The integration and adjustability of a multi-property device can provide significant advantages in electronics manufacturing.

15 Claims, 23 Drawing Sheets

Related U.S. Application Data a continuation-in-part of application No. 15/250,993, filed on Aug. 30, 2016, and a continuation-in-part of application No. 15/273,703, filed on Sep. 23, 2016.

(60) Provisional application No. 62/194,256, filed on Jul. 19, 2015, provisional application No. 62/211,792, filed on Aug. 30, 2015, provisional application No. 62/232,419, filed on Sep. 24, 2015, provisional application No. 62/266,618, filed on Dec. 13, 2015, provisional application No. 62/279,649, filed on Jan. 15, 2016.

(51) Int. Cl.

| | | |
|---|---|---|
| *H01L 23/00* | (2006.01) | |
| *H01L 23/498* | (2006.01) | |
| *H01L 21/48* | (2006.01) | |
| *H05K 1/02* | (2006.01) | |
| *H01L 23/60* | (2006.01) | |
| *H05K 3/12* | (2006.01) | |
| *H05K 3/22* | (2006.01) | |
| *G06F 17/50* | (2006.01) | |
| *H01F 27/28* | (2006.01) | |
| *H01F 27/24* | (2006.01) | |
| *H01C 7/18* | (2006.01) | |
| *H01G 4/30* | (2006.01) | |
| *H01G 4/005* | (2006.01) | |
| *H01G 4/012* | (2006.01) | |
| *H01G 4/232* | (2006.01) | |
| *H05K 1/16* | (2006.01) | |
| *H01G 4/12* | (2006.01) | |

(52) U.S. Cl.
CPC ........ *H01L 23/15* (2013.01); *H01L 23/49816* (2013.01); *H01L 23/49838* (2013.01); *H01L 23/60* (2013.01); *H01L 24/16* (2013.01); *H05K 1/0218* (2013.01); *H05K 3/1283* (2013.01); *H05K 3/227* (2013.01); *H01G 4/1227* (2013.01); *H01L 2224/131* (2013.01); *H01L 2224/16227* (2013.01); *H01L 2224/73253* (2013.01); *H01L 2924/15311* (2013.01); *H01L 2924/15787* (2013.01); *H01L 2924/16251* (2013.01); *H01L 2924/19041* (2013.01); *H01L 2924/19042* (2013.01); *H01L 2924/19043* (2013.01); *H01L 2924/3025* (2013.01); *H05K 1/162* (2013.01); *H05K 1/165* (2013.01); *H05K 1/167* (2013.01)

(56) References Cited

U.S. PATENT DOCUMENTS

| | | | |
|---|---|---|---|
| 3,775,838 | A | 12/1973 | Dalmasso |
| 3,864,817 | A | 2/1975 | Lapham |
| 5,697,043 | A | 12/1997 | Baskaran |
| 5,888,329 | A | 3/1999 | Cho |
| 6,141,040 | A | 10/2000 | Toh |
| 6,365,480 | B1 | 4/2002 | Huppert |
| 6,365,960 | B1 | 4/2002 | Pollock |
| 7,199,016 | B2 | 4/2007 | Heston |
| 7,495,891 | B2 | 2/2009 | Lee |
| 7,667,302 | B1 | 2/2010 | Chang |
| 7,766,641 | B2 | 8/2010 | Silverbrook |
| 8,054,608 | B2 | 11/2011 | Yoon |
| 8,163,077 | B2 | 4/2012 | Eron |
| 8,193,532 | B2 | 6/2012 | Arai |
| 8,581,381 | B2 | 11/2013 | Zhao |
| 2006/0022787 | A1* | 2/2006 | Brennan ............ H01F 17/0006 336/200 |
| 2008/0043061 | A1* | 2/2008 | Glezer ................ H02K 33/18 347/53 |
| 2008/0272468 | A1* | 11/2008 | Ghaghahi ............ H01L 23/552 257/659 |
| 2010/0289128 | A1 | 10/2010 | Camacho |
| 2013/0114182 | A1 | 5/2013 | Suh |

\* cited by examiner

METHODS AND SYSTEMS TO IMPROVE PRINTED ELECTRICAL COMPONENTS AND FOR INTEGRATION IN CIRCUITS

CLAIMS OF PRIORITY

This patent application is a continuation-in-part of:
(1) U.S. utility patent application Ser. No. 15/212,297, titled 'Methods and systems for increasing surface area of multi-layer ceramic capacitors' filed on Jul. 18, 2016, which claims benefit of U.S. provisional patent application No. 62/194,256, titled 'Methods and systems for increasing capacitance of multi-layer ceramic capacitors', filed on Jul. 19, 2015.
(2) U.S. utility patent application Ser. No. 15/250,993, titled 'Methods and systems for geometric optimization of multi-layer ceramic capacitors' filed on Aug. 30, 2016, which claims benefit of U.S. provisional patent application No. 62/211,792, titled 'Methods and systems for geometric optimization of multi-layer ceramic capacitors', filed Aug. 30, 2015.
(3) U.S. utility patent application Ser. No. 15/273,703, titled 'Methods and systems for material cladding of multilayer ceramic capacitors' filed on Sep. 23, 2016, which claims benefit of U.S. provisional patent application No. 62/232,419, titled 'Methods and systems for material cladding of multi-layer ceramic capacitors', filed Sep. 24, 2015.
(4) U.S. provisional patent application No. 62/266,618, titled 'Methods and systems to improve printed electrical components and for integration in circuits', filed Dec. 13, 2015.
(5) U.S. provisional patent application No. 62/279,649, 'Methods and systems to minimize delamination of multi-layer ceramic capacitors', filed Jan. 15, 2016.

FIELD OF TECHNOLOGY

This disclosure relates generally to systems and methods to improve 3D printed electrical components and to integrate passive components in ceramic chip package using the technique of drop-on-demand additive printing to deposit droplets of deposition material.

BACKGROUND

Photolithography has been a standard method of printed circuit board (PCB) and microprocessor fabrication. The process uses light to make the conductive paths of a PCB layer and the paths and electronic components in a silicon wafer of microprocessors.

The photolithography process involves light exposure through a mask to project the image of a circuit, similar to a negative image in standard photography. This process hardens a photo-resistive layer on the PCB or wafer. The hardened areas stay behind in the form of circuit paths of printed circuit boards (PCBs) and central processing units (CPUs). Unexposed areas are then dissolved away by a solution bath, such as an acid in wet methods or plasma-like oxygen ions in dry methods. A PCB might have as many as twelve or more of these layers and a processor may reach upwards of thirty or more, with some comprising metallic conductive layers and others insulating layers. Other steps include deposition of conductive metallic elements.

Process shrinks, also known as die shrinks, are one of the main ways that the miniaturization of electronic devices is made possible. Photolithography process shrinks involve miniaturization of all semiconductor devices, particularly transistors. Processors made on a smaller scale generally mean more CPUs per wafer, either for cheaper production or a more complex and powerful processor in a given die size. Progress in miniaturization also fosters faster transistor switching speeds and lower power consumption, so long as there is not too much current leakage (which is one of the challenges that increase with this progress).

Photolithography is the selective removal of the oxide in a desired area of a substrate. Thus, the areas over which diffusions are effective are defined by the oxide layer with windows cut in it, through which diffusion can take place. The windows are produced by the photolithographic process. This process is the means by which microscopically small electronic circuits and devices can be produced on silicon wafers resulting in billions of transistors on a 1 cm by 1 cm chip.

However, partly due to its lack of a high-temperature fusing process such as sintering, photolithography has had very limited value in integrating relatively large capacitors, inductors, and resistors ("passive" components), forcing the continued use of discrete components. Manufacturing with discrete components is inherently more expensive, bulky, and wasteful of material than an integrated approach. Instead of trying to mount the larger components, onto a chip, or create them with photolithography, a more efficient and effective system and method of integration is required.

SUMMARY

Disclosed are methods and systems to improve passive components and for integration in ceramic chip package using 3D Printing. The methods and systems disclosed herein may be implemented in any means for achieving various aspects. Other features will be apparent from the accompanying drawings and from the detailed description that follows.

Recently, it has become possible to create passive components using additive manufacturing, also known as 3D Printing, where ink jets or aerosol jets deposit materials such as ceramic slurry, conductive ink, ferrite paste, and carbon resistor paste. This is an inherently more precise and repeatable process than traditional methods, and produces higher density components with less material waste. The materials just named can all be sintered at high temperature, so they are amenable to integrated manufacture, which was previously not available in photolithography. Sintering of ceramic powder material provides an advantage over the prior art, such as, e.g., to produce an insulator layer that allows for an improvement in dielectric strength of approximately one thousand fold compared to previous procedures that can only print capacitors comprising films, e.g., a plastic film insulator layer.

In one aspect, the present invention discloses a system and a method to print electrical components, such as, e.g., multi-layer ceramic capacitors, inductors and/or resistors, into the solid ceramic block of an integrated circuit that is used in its packaging. Previously, passive electrical components have been mounted on the chip or created through photolithography, however, they can be created with high-temperature sintering comprising exposed conductors designed to mate with the solder joints (or other conductive scheme) on the chip. Sintering of ceramic powder material provides an advantage over the prior art, such as, e.g., to produce an insulator layer that allows for an improvement in dielectric strength of approximately one thousand fold compared to previous procedures that print capacitors comprising film, e.g., a plastic film insulator layer. The ceramic block may still provide stiffness and strength, but in addition, it forms the matrix for the passive components. A conductive plane may be printed in between adjacent electrical components, or a conductive cage may be printed to encapsulate each individual component to block unwanted parasitic effects.

In another aspect, the present invention discloses a system and a method for improving printed electrical components, such as, e.g., capacitors, resistors, inductors and components with artificially combined properties of capacitance, resistance and inductance. In addition to the properties being adjustable based on predetermined values, the integration of a multi-property device can provide significant advantages in electronics manufacturing as it allows for increased functionality per unit volume and unit weight, and decreasing cost through the reduction of manufacturing material.

BRIEF DESCRIPTION OF THE DRAWINGS

Example embodiments are illustrated by way of example and are not limited to the figures of the accompanying drawings, in which, like references indicate similar elements.

DETAILED DESCRIPTION

Disclosed are systems and methods for improving printed electrical components and for integrating in ceramic chip packages. Although the present embodiments have been described with reference to specific example embodiments, it will be evident that various modifications and changes may be made to these embodiments without departing from the broader spirit and scope of the various embodiments. In addition, the components shown in the figures, their connections, couples, and relationships, and their functions, are meant to be exemplary only, and are not meant to limit the embodiments described herein.

Photolithography is the standard method of printed circuit board (PCB) and microprocessor fabrication. The process uses light to make the conductive paths of a PCB layer and the paths and electronic components in the silicon wafer of microprocessors. The ability to use photolithography to "print" transistors and other electronic devices on semiconductor material led to spectacular improvements in integrated circuit density (and reduction in cost) over the last six decades. The photolithography technique has had very limited value in integrating high-specification capacitors, inductors, and resistors ("passive" components), forcing the continued use of discrete components. Manufacturing with discrete components is inherently more expensive, bulky, and wasteful of material than an integrated approach. The goal, therefore, is to find a practical and high-density way to produce integrated passive components.

The photolithography process uses light to transfer a geometric pattern from a photomask to a light-sensitive chemical called "photoresist", onto a substrate. A series of chemical treatments then either engraves the exposure pattern into, or enables deposition of a new material in the desired pattern upon, the material underneath the photoresist. Photolithography shares some fundamental principles with photography in that the pattern in the etching resist is created by exposing it to light, either directly (without using a mask) or with a projected image using an optical mask.

Figure 1:
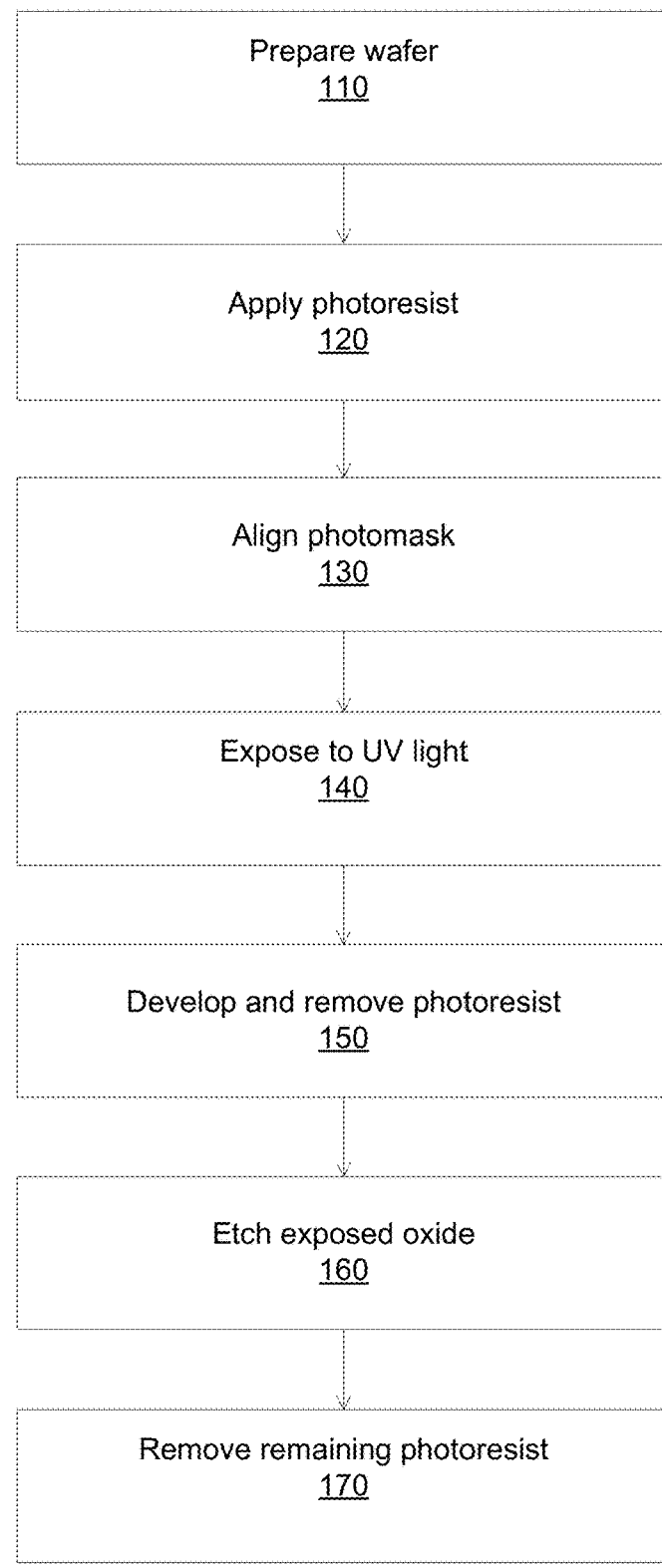
FIG. 1 is a flowchart of an overview process of photolithography.

FIG. 1 is a flowchart of an overview prior art process of photolithography used to create integrated chips. A single iteration of photolithography may combine several steps in sequence performed in a cleanroom. Cleanrooms are typically automated and robotic wafer track systems are used to coordinate the process from beginning to end.

Operation 110 prepares the substrate water. The wafer may be initially heated to a temperature sufficient to drive off any moisture on wafer surface, such as, e.g., 150° C. for ten minutes. Operation 120 applies a photoresist, a light-sensitive liquid, to the center of an oxidized silicon wafer. The wafer may be spun rapidly to produce a uniform layer. Operation 130 aligns a photomask. The coated wafer is now placed in an apparatus called a mask aligner in very close proximity to the photomask. The photomask has a photographic emulsion or thin film metal (generally chromium) pattern on one side. The pattern has clear and opaque areas. Operation 140 exposes the silicon wafer to UV light. A highly collimated ultraviolet (UV) light may be turned on and the areas of the silicon wafer that are not covered by the photomask are exposed to ultraviolet radiation. Positive photoresist, the most common type, becomes soluble in the developer when exposed; with negative photoresist, unexposed regions are soluble in the developer.

Operation 150 develops and removes photoresist exposed to UV light. In the event that a negative photoresist is used, the areas of the photoresist that are exposed to the ultraviolet radiation become polymerized. The resisting photoresist pattern after the development process will therefore be a replication of the photomask pattern, with the clear areas on the photomask corresponding to the areas where the photoresist remains on the wafers. An opposite type of process occurs with positive photoresist. After development and rinsing, the wafers are usually given a "post-bake" in an oven at a temperature of about 150° C. for about 30 to 60 minutes to toughen further the remaining resist on the wafer. The resulting wafer is then "hard-baked", which may solidify the remaining photoresist, to make a more durable protective layer in future ion implantation, wet chemical etching, or plasma etching. Operation 160 etches the exposed oxide layer. A liquid ("wet") or plasma ("dry") chemical agent removes the uppermost layer of the substrate in the areas that are not protected by photoresist. The exposed semiconductor underneath are ready for impurity diffusion. Operation 170 removes the remaining photoresist.

Figure 2:
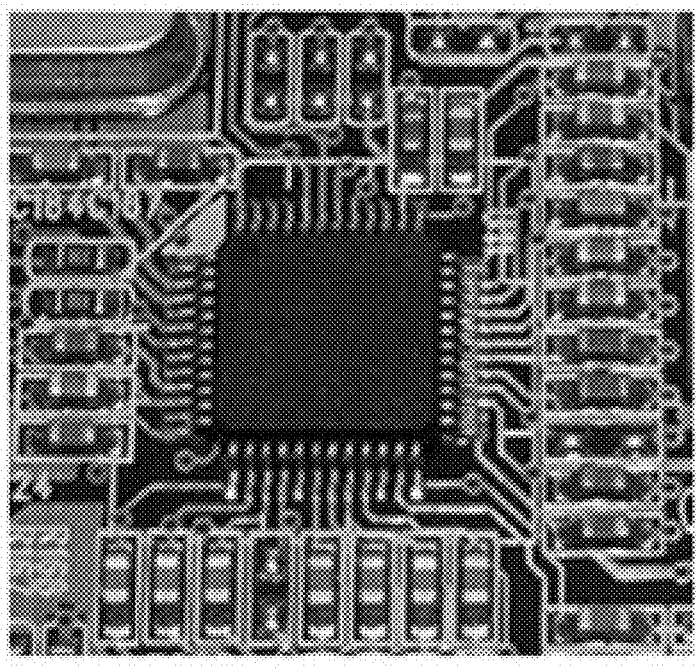
FIG. 2 is a typical surface-mount processor chip with discrete passive components.

FIG. 2 is a typical surface-mount processor chip with discrete passive components. The dark square in the center is a processor chip made from a semiconductor and encased in ceramic (the "chip package") that protects the chip from moisture. Surrounding that chip are two-electrode devices, such as, e.g., mostly multi-layer ceramic capacitors (MLCCs).

Figure 3:
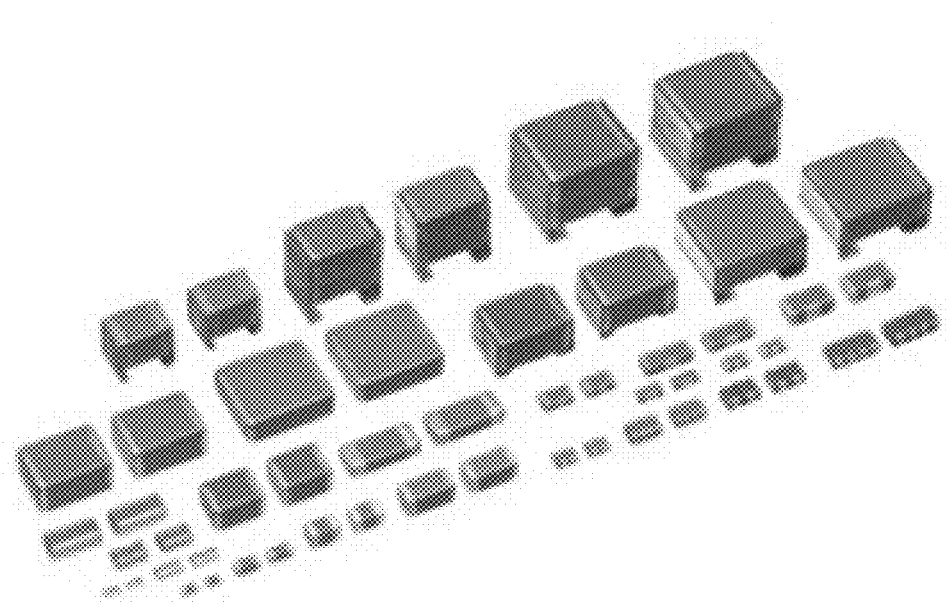
FIG. 3 shows the various sizes of discrete multilayer ceramic capacitors.

FIG. 3 shows the various sizes of discrete multilayer ceramic capacitors. MLCCs are currently manufactured as discrete components in a wide range of sizes and specifications. Even the smallest MLCC in general use may be millions of times larger than the transistors in integrated devices. That is one reason they are difficult to integrate lithographically. Another reason is that the ceramic material in an MLCC is made with a high-temperature process that would destroy the devices that are created lithographically. Therefore, efforts to integrate passive components have, to date, focused on placing them on the semiconductor wafer prior to packaging.

Plastic or ceramic packaging involves mounting a die, connecting die pads to the pins on the package, and sealing the die. Tiny wires are used to connect the pads to the pins. Traditionally, these wires comprise gold leading to a lead frame of solder-plated copper.

Figure 4:
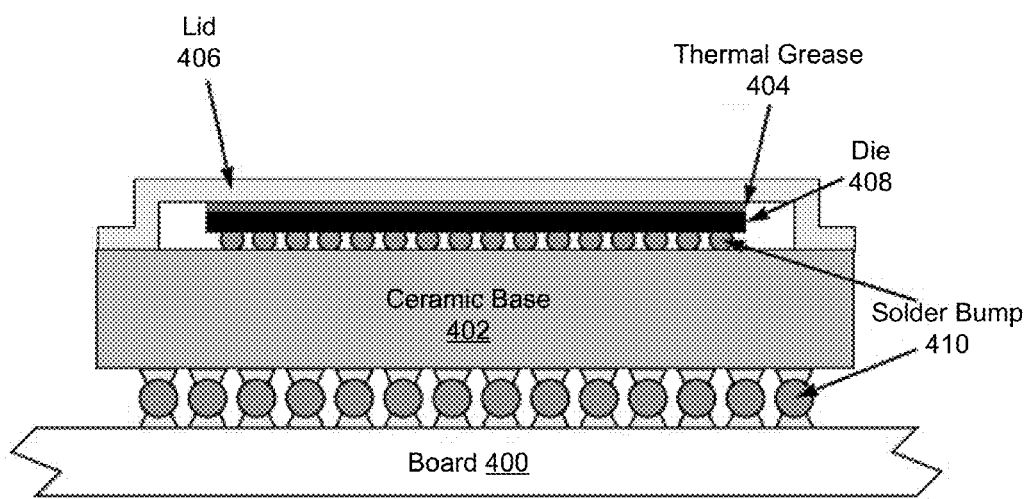
FIG. 4 is a typical packaging of an integrated chip circuit chip.

FIG. 4 is a typical packaging of an integrated chip circuit chip, according to at least one embodiment. A typical "flip chip" packaging style is shown. Board 400 may be a multilayer printed circuit board similar to that shown holding the components in FIG. 2. Discrete components such as, e.g., MLCCs, are mounted separately through conductive paths printed on board 400. Ceramic base 402 may comprise an ordinary ceramic material, formed by high temperature sintering; it provides mechanical strength and stiffness, since any flexing might break electrical connections. Thermal grease 404 may be applied between lid 406 and circuit die 408. Lid 406 may encapsulate die 408 to protect and insulate die 408 from the outside environment. Board 400 and die 408 may both be coupled to ceramic base 402 by an array of solder bump 410.

Recently, it has become possible to create passive components using additive manufacturing, also known as 3D Printing, where ink jets or aerosol jets deposit materials such as ceramic slurry, conductive ink, ferrite paste, and carbon resistor paste. This is an inherently more precise and repeatable process than traditional methods, and produces higher density components with less material waste. The materials just named can all be sintered at high temperature, so they are amenable to integrated manufacture, which was previously not available in photolithography. Sintering of ceramic powder material provides an advantage over the prior art, such as, e.g., to produce an insulator layer that allows for an improvement in dielectric strength of approximately one thousand fold compared to previous procedures that can only print capacitors comprising films, e.g., a plastic film insulator layer.

Figure 5:
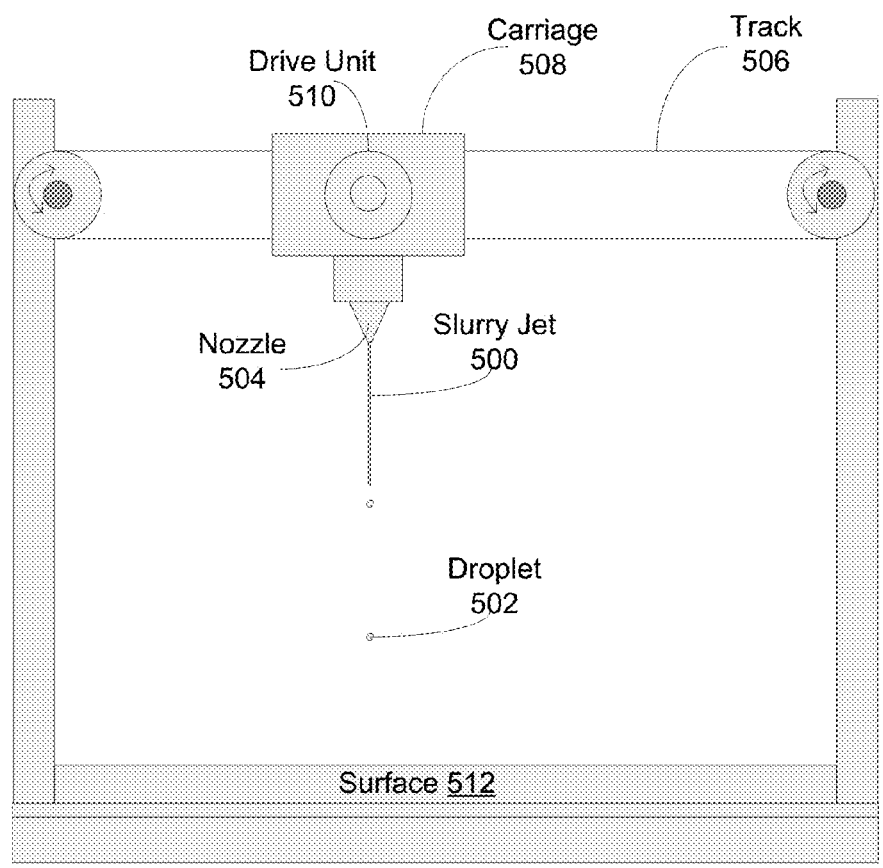
FIG. 5 is a system of a drop-on-demand type additive printer that may be used to implement one or more embodiments of the present invention.

FIG. 5 is a system of a drop-on-demand type additive printer that may be used to implement one or more embodiments of the present invention. A slurry jet 500 may be dispensed from a nozzle 504 having an orifice comprising an opening, and may be raster or vector scanned on track 506 by a carriage 508 driven by drive unit 510 over a surface 512 or on top of an already formed powder bed to define a new layer. Pressure may be used to force the slurry out of the nozzle and into a continuous stream of slurry jet 500 and/or as droplet 502, which may be defined as a breakup of the flow. A layer surface height measurement unit, such as, e.g., a laser rangefinder may be used to receive an input signal to control the height of the surface that is formed by varying the delivery of slurry.

A typical implementation of an additive manufacturing process begins with defining a three-dimensional geometry of the product using computer-aided design (CAD) software. This CAD data is then processed with software that slices the model into a plurality of thin layers, which are essentially two-dimensional. A physical part is then created by the successive printing of these layers to recreate the desired geometry. This process is repeated until all the layers have been printed. Typically, the resulting part is a "green" part, which may be an unfinished product that can undergo further processing, e.g., sintering. The green part may be dense and substantially non-porous. In some circumstances, the part may be a final part.

Figure 6:
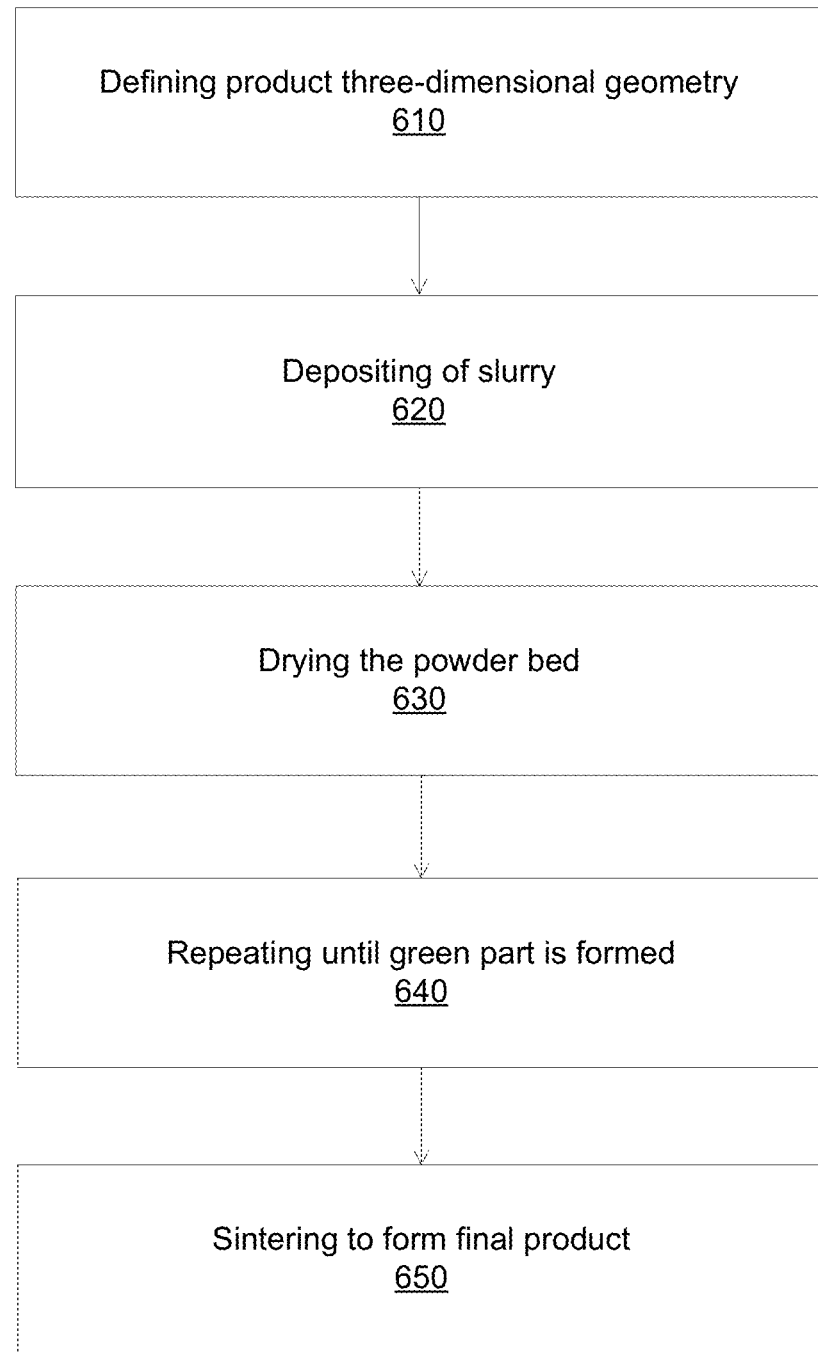
FIG. 6 is a flow diagram of a method of an additive printing process that may be implemented with one or more embodiments of the present invention.

FIG. 6 is a flow diagram of a method of an additive printing process that may be implemented with one or more embodiments of the present invention. Operation 610 defines a final product's three-dimensional geometry using CAD software. Operation 620 deposits layers of slurry comprising powder material onto a surface or on top of a powder bed, which then slip-casts to make a new layer. As the slurry deposits in each two dimensional layer, the printer may select insulator and/or conductor as the material type, in separate passes or as a combined pass. The slurry may be deposited in any suitable manner, including depositing in separate, distinct lines, e.g., by raster or vector scanning, by a plurality of simultaneous jets that coalesce before the liquid slip-casts into the bed, or by individual drops. The deposit of slurry drops may be individually controlled, thereby generating a regular surface for each layer. Operation 630 dries any liquid from the powder bed, e.g., infrared flash-dry, after deposition of each layer. Operation 640 repeats operations 620 and 630 until a green part is formed. Operation 650 sinters the green part to form a final product. Sintering is a solid-state diffusion process that may be enhanced by increasing the surface area to volume ratio of the powder in any green part that is subsequently sintered.

In at least one embodiment, the present invention discloses a system and a method to 3D print electrical components, such as, e.g., multilayer ceramic capacitors, inductors and/or resistors, into the solid ceramic block of an integrated circuit that is used in its packaging. Previously, passive electrical components have been mounted on the chip or created through photolithography, however, they can be created with high-temperature sintering comprising exposed conductors designed to mate with the solder joints (or other conductive scheme) on the chip. Sintering of ceramic powder material provides an advantage over the prior art, such as, e.g., to produce an insulator layer that allows for an improvement in dielectric strength of approximately one thousand fold compared to previous procedures that print capacitors comprising film, e.g., a plastic film insulator layer. The ceramic block may still provide stiffness and strength, but in addition, it forms the matrix for the passive components.

Figure 7:
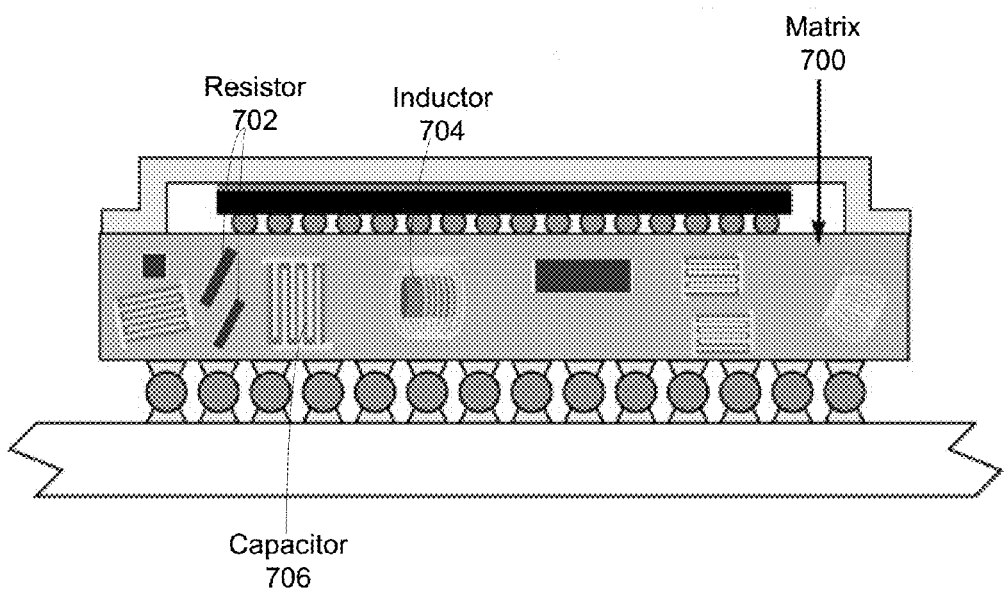
FIG. 7 is a schematic of an integration of passive components in a ceramic part of a chip packaging, according to at least one embodiment.

FIG. 7 is a schematic of an integration of passive components in a ceramic part of a chip packaging, according to at least one embodiment. In the present figure, depth dimension, component interconnects, components to PCB connections, and conductive shieldings were omitted for clarity. This figure illustrates an inventive concept of the present disclosure, as applied to the form of packaging shown in FIG. 4. Ceramic matrix 700 may comprise resistor 702 represented by a dark rectangle, inductor 704 represented by a helical shape (with or without a ferrite core), and capacitor 706 represented by a multilayer zig-zag shape. They are shown in different proportions and in different angles to emphasize that the orientation and form factors of the passive elements are highly flexible and not constrained to being axis-aligned. Their individual geometries can be curved, warped, zig-zag or any other shape. One advantage of being able to angle the components is that it provides control of the parasitic effects the components have on each other and on the devices within the chip.

It is also possible to 3D print an air gap between devices (permittivity of approximately 1.0), up to predetermined minimal strength and stiffness threshold requirements to sufficiently support the chip substrate. For aerosol and inkjet 3D printers, overhang may not be possible, so any air gaps must be placed at the top of the device in its construction orientation. The device can be placed at any angle after completion of manufacture.

As part of the design of any such 3D-printed ceramic matrix, a computer modeling program such as, e.g., COMSOL, may be employed to optimize the layout and check for cross-interference between elements. It is important to prevent effects such as resonance or parasitic effects that can spoil the behavior of the chip or force the use of lower-speed chip operation.

Figure 8:
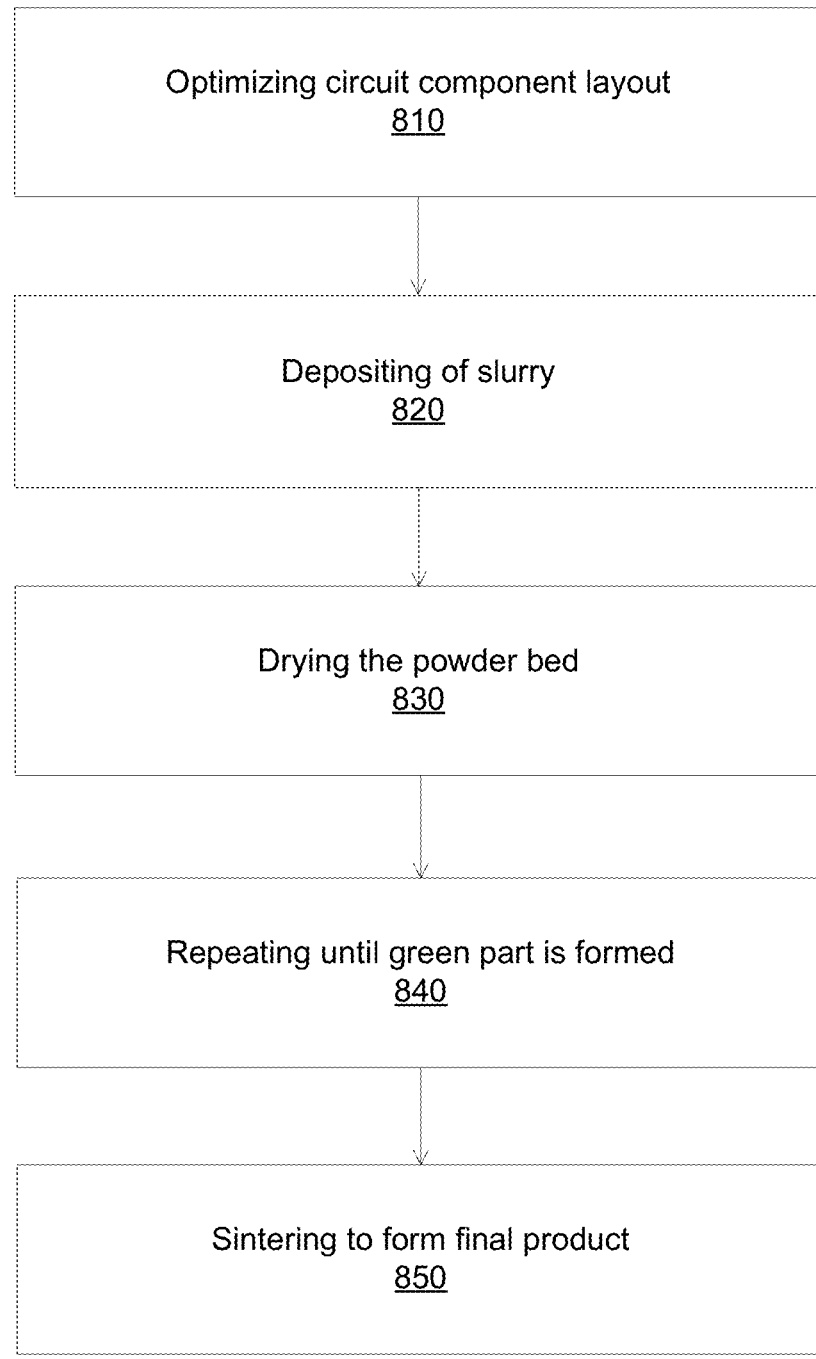
FIG. 8 is a flow diagram of a method of an additive printing process that may be implemented with one or more embodiments of the present invention.

FIG. 8 is a flow diagram of a method of an additive printing process that may be implemented with one or more embodiments of the present invention. Operation 810 optimizes a circuit's component layout using CAD software. An algorithm of a computing device comprising a memory and a processor may be used to determine space, position and orientation of each individual component of an integrated chip during a planning phase prior to construction of the chip. Operation 820 deposits layers of slurry comprising powder material onto a surface or on top of a powder bed, which then slip-casts to make a new layer. As the slurry deposits in each two dimensional layer, the printer may select insulator and/or conductor as the material type, in separate passes or as a combined pass. The slurry may be deposited in any suitable manner, including depositing in separate, distinct lines, e.g., by raster or vector scanning, by a plurality of simultaneous jets that coalesce before the liquid slip-casts into the bed, or by individual drops. The deposit of slurry drops may be individually controlled, thereby generating a regular surface for each layer. Operation 830 dries any liquid from the powder bed, e.g., infrared flash-dry, after deposition of each layer. Operation 840 repeats operations 820 and 830 until a green part is formed. Operation 850 sinters the green part to form a final product. Sintering is a solid-state diffusion process that may be enhanced by increasing the surface area to volume ratio of the powder in any green part that is subsequently sintered.

One challenge in integrated circuit packaging is to avoid parasitic capacitance and parasitic inductance. In real electrical circuits, parasitic capacitance and parasitic inductance are unavoidable and usually unwanted effects that exists between the parts of electronic components or circuits simply because of their proximity to each other. One way to minimize parasitic effects is to use a "Faraday cage" (or Faraday shield), which is simply a grounded conductor placed between the coupling source and affected component. By precise printing of a conductive material around the electrical component in the ceramic block using 3D Printing technique and connecting it to a ground, a Faraday cage is formed and the parasitic effect is greatly reduced.

Figure 9A:
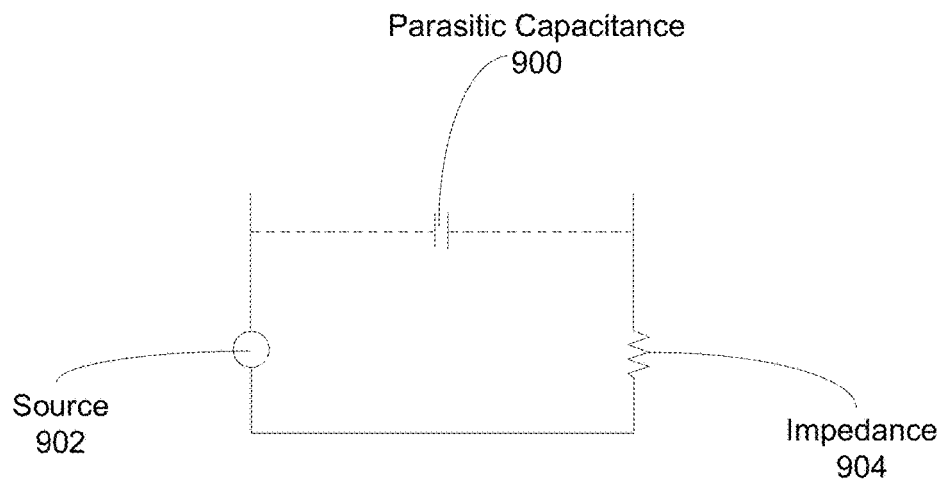
FIGS. 9A-B is a circuit showing a high-frequency noise source coupled to a system impedance through a stray capacitance.
Figure 9B:
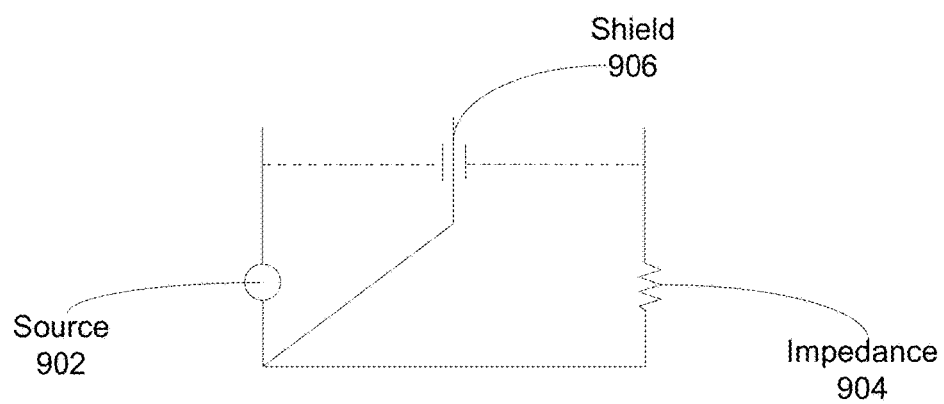

FIGS. 9A-B is a circuit showing a high-frequency noise source coupled to a system impedance through a stray capacitance, according to at least one embodiment. In FIG. 9A, parasitic capacitance 900 may be caused by the close proximity of noise source 902 and circuit impedance 904. If there is little or no control over source 902 or the location of impedance 904, the next best solution may be to interpose a Faraday shield. FIG. 9B shows Faraday shield 906 interrupting the coupling electric field. Shield 906 causes noise 902 and coupling currents to return to their source without flowing through the circuit impedance 904.

Inductive coupling effect is one example of parasitic effects, and refers to the transfer of energy from one circuit component to another through a shared magnetic field when these components are placed in close proximity. A change in current flow through one device induces voltage change and current flow in the other device. Inductive coupling is an unwanted parasitic effect that affects the performance of the semiconductor devices. The effect can be mitigated by 3D printing a conductive plane or capsule, e.g., as a Faraday shield or a Faraday cage, between the adjacent devices, or around the individual device, and connecting the conductive plane or capsule to a ground. This approach allows passive components to be printed at high density in a way that is difficult to achieve without additive manufacturing. In a system which passive components are added as discrete components, designing a custom-shaped shielding around each component can greatly increase manufacturing cost. However, with 3D Printing technique, manufacturing a conductor plane or capsule for custom-shaped shielding is just as easy as printing other electrical components.

Figure 10A:
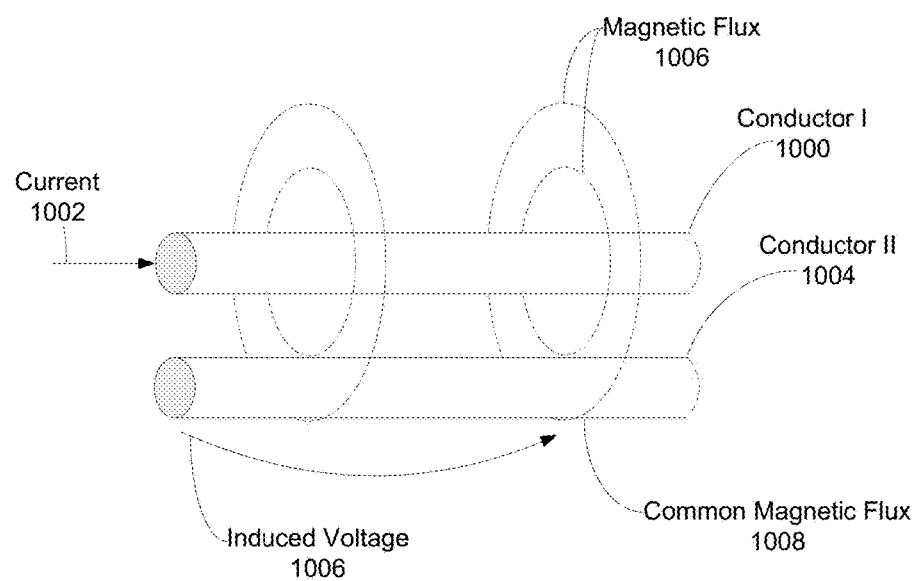
FIGS. 10A-B illustrate embedded conductors of an integrated circuit that exhibit unintended effects, according to at least one embodiment.
Figure 10B:
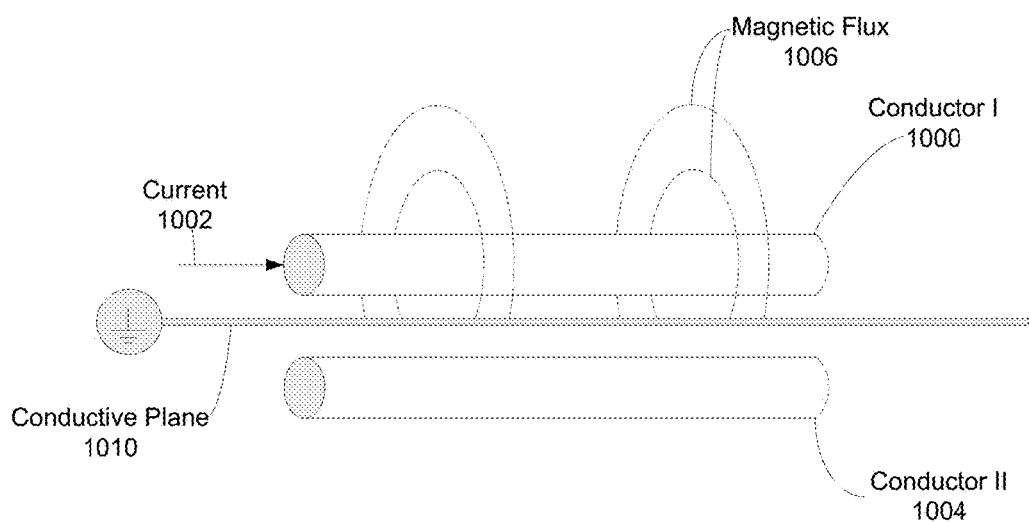

FIGS. 10A-B illustrate embedded conductors of an integrated circuit that exhibit unintended effects, according to at least one embodiment. The conductors may be 3D printed into the ceramic block and may experience the effect shown in FIG. 10A. Conductor I 1000 may be live with current 1002 flowing through, while conductor II 1004, such as from a separate device or the same device, may be at rest. The close proximity of conductor I 1000 and conductor II 1004 may create induced voltage flow 1006 through conductor II 1004 due to magnetic flux 1006 of conductor I 1000. The magnetic flux 1006 of conductor I 1000 may influence (induct) conductor II 1004 through contact with a common magnetic flux 1008 shared between conductor I 1000 and conductor II 1004. In FIG. 10B, by using a system and a method of the present invention of additive manufacturing, a conductive plane 1010 may be printed between conductor I 1000 and conductor II 1004. The precision of the system and the method allows for the thinnest amount of conductive material to be used to print the conductive plane that is required to keep magnetic flux 1006 of conductor I 1000 from inducing conductor II 1004, such as, e.g., a voxel of material thick. The minimal material used allows for higher density printing of the grounded conductive plates, while keeping costs low or constant. Conductive plane 1010 may be connected to a ground.

In the present invention, the embedded 3D-printed conductors may experience inductive coupling effects because the electrical components are close to each other.
With the ability to print very thin layers of the grounded conductive plate or capsule for every electrical component, the parasitic effects can be greatly reduced while allowing electric components in the ceramic block to be printed at a very high density.

Figure 11:
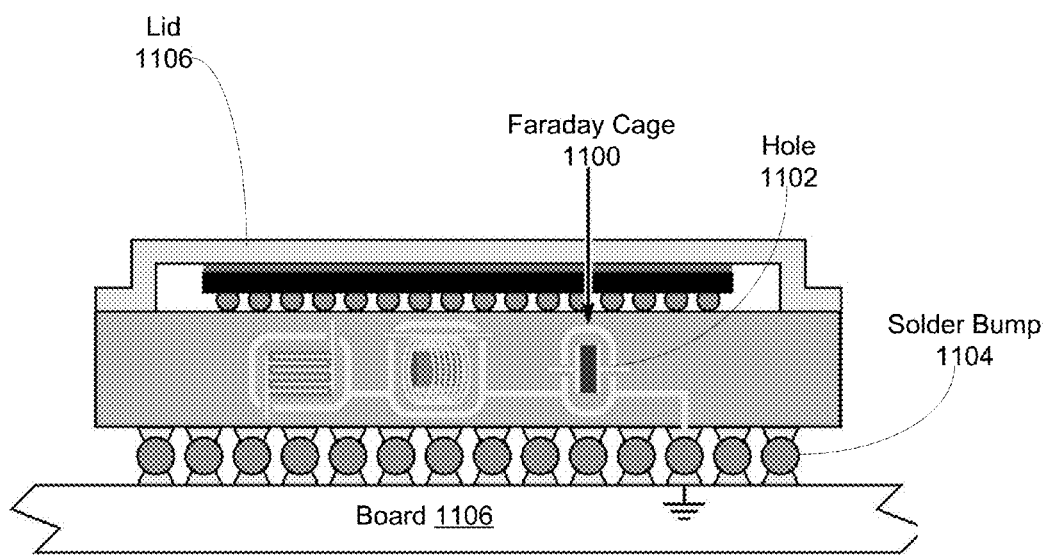
FIG. 11 is a schematic diagram of an integrated circuit, wherein a Faraday cage is positioned around each individual component, according to at least one embodiment.

FIG. 11 is a schematic diagram of an integrated circuit, wherein a Faraday cage is positioned around each individual component, according to at least one embodiment. Faraday cage 1100 may be a grounded conductor that encapsulates individual embedded devices to block unwanted flux. The encapsulation may take the general shape of the device it encapsulates, and may be slightly larger in a manner to not make physical contact with the device. The precision of the system and the method allows for the thinnest amount of conductive material to be used to print the cage that is required to minimize parasitic effects, such as, e.g., a voxel of material thick. The encapsulation may comprise one or more hole 1102 to allow passage of electrodes through small openings. For example, hole 1102 may comprise a predetermined minimum diameter to keep the Faraday cage 1100 effective, while does not make contact with another conductive material. The encapsulation would reduce unwanted effects, such as, e.g., parasitic effects, such that the devices can be placed more closely to one another without interference, such as, e.g., a distance of less than 10 microns.

A Faraday cage may be grounded by a connection to a solder bump 1104, which is subsequently grounded to a printed circuit board 1106, as shown in the figure. However, it may be possible for lid 1106 to be grounded, and therefore grounding of the capsules to lid 1106 may be beneficial. Additionally, there may be more than one ground in an effort to control signal noise.

A ceramic integrated-circuit package may comprise a small, square, conducting lid soldered onto a metallized rim on the ceramic package top. The metallized rim may be connected to one of the corner pins of the package, or it may be left unconnected. Most logic circuits have a ground pin at one of the package corners, and therefore the lid is grounded. But many analog circuits do not have a ground pin at a package corner, and the lid is left floating. Traditionally, a wire may be soldered to the lid (this will not damage the device, as the chip is thermally and electrically isolated from the lid). If soldering to the lid is unacceptable, a grounded phosphor-bronze clip may be used to make the ground connection, or conductive paint can be used to connect the lid to the ground pin. The additive manufacturing technique of the present invention may allow precise adjusting of Faraday shielding which may in turn reduce or minimize electromagnetic leaks from the lid.

Figure 12:
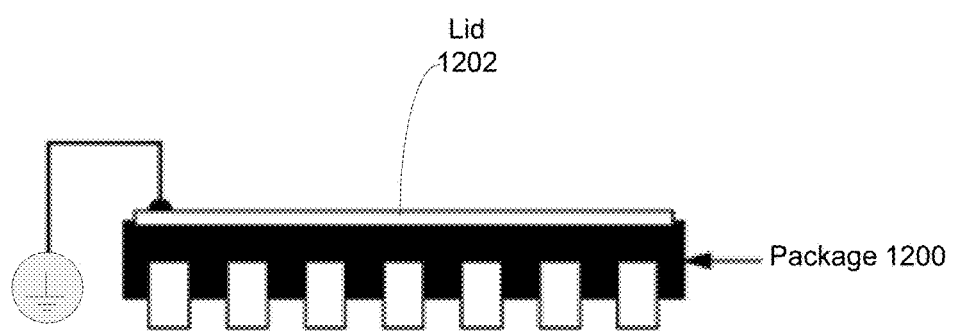
FIG. 12 illustrates a ceramic integrated circuit package comprising a grounded lid, according to at least one embodiment.

FIG. 12 illustrates a ceramic integrated circuit package comprising a grounded lid, according to at least one embodiment. The system and method of the present invention may print a ceramic chip package 1200 comprising lid 1202, which may be a grounded conductor. In this case, a component's Faraday cage may be connected to lid 1202 instead of a solder bump.

Figure 13:
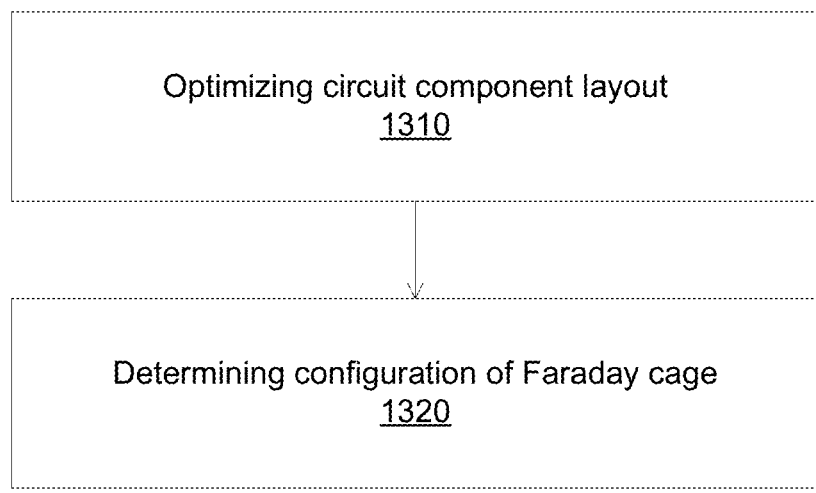
FIG. 13 is a flow diagram of a method of an additive printing process that may be implemented with one or more embodiments of the present invention.

FIG. 13 is a flow diagram of a method of an additive printing process that may be implemented with one or more embodiments of the present invention. Operation 1310 optimizes a circuit's component layout using CAD software. An algorithm of a computing device comprising a memory and a processor may be used to determine space, position and orientation of each individual component of an integrated chip during a planning phase prior to construction of the chip. Operation 1320 determines configuration of Faraday shielding for all components such as, e.g., capacitors, inductors, and resistors. The algorithm may also determine Faraday shielding in order to minimize electromagnetic leaks from the lid.

In at least one embodiment, the present invention also discloses a system and a method for improving printed electrical components, such as, e.g., capacitors, resistors, inductors and components with artificially combined properties of capacitance, resistance and inductance. In addition to the properties being adjustable based on predetermined values, the integration of a multi-property device can provide significant advantages in electronics manufacturing as it allows for increased functionality per unit volume and unit weight, and decreasing cost through the reduction of manufacturing material. Other devices are 3D-printable with the same set of materials and technologies. For example, by printing two helices of different pitch sharing a common core, a voltage transformer is obtained.

In at least one embodiment, the present invention discloses a system and a method to improve a resistor through 3D Printing. Carbon paste can be used to print resistors. Mass-manufactured resistors may be subjected to high amounts of variation in their resistivity, e.g., ±20%, though techniques such as an additional step of laser trimming can reduce variation below 1%, as well as restriction to specific standard ohm values (powers of ten times 10, 15, 22, 33, 47, or 68). With 3D printing, the geometry is so precisely controllable and repeatable that variation can be far lower in a single manufacturing step compared to the use of trimming. They can also be made to any value, economically, without adherence to a preferred number series.

Furthermore, the ability to vary both the thickness (cross sectional area) and the length of a resistor provides the ability to select the wattage rating of a resistor and not just the resistance value. Higher cross section increases the wattage rating, the amount of power a resistor can dissipate before it fails. Higher cross section also reduces resistance, which is compensated by making the resistor longer. Other variations in shape parameters are also possible, such as the eccentricity of the cross section. For closest-possible packing of components, it may be desirable to allow resistors to be unusual, complex geometries that fill in the spaces between inductors and capacitors, since resistors are the most forgiving of being non-ideal shapes of the three types of passive component. An algorithm may be used to find the most effective parameters in a resistor design.

FIGS. 14A-G show alternative configurations for resistor shape allowed by the additive manufacturing technique of the present invention, according to some embodiments. Individual components of an integrated circuit may be positioned on and within the circuit first while remaining spaces are used to position resistors of different geometries, such as varying shapes and sizes. The placement of the resistors after all of the other electrical components on the integrated circuit allows for optimized configurations of the integrated circuit, such as, e.g., minimizing (or maximizing) parasitic effects, without the need for significant consideration of the space remaining.

Figure 14A:
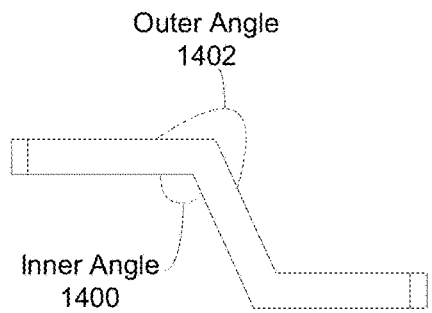
FIGS. 14A-G show alternative configurations for resistor shape allowed by the additive manufacturing technique of the present invention, according to some embodiments.
Figure 14B:
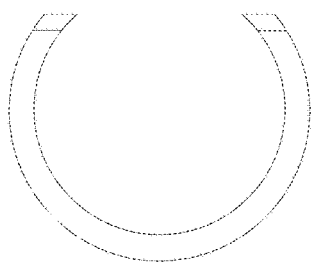

FIG. 14A is a Z-shape resistor comprising three linear segments joined together by two vertices, resembling the letter Z. The configuration of the Z-shape resistor may be altered by adjustment of any individual inner angle 1400 or outer angle 1402, both of which produce opposing effects on its shape. The Z-shape resistor may also vary in individual segment lengths and/or number of segments; however, each vertex may join no more than two segments. FIG. 14B is a U-shape resistor comprising a single segment that may be bent into a semi- or nearly-closed-circle. On the other hand, the segment may be divided into three individual pieces joined at two vertices in such a manner where the resistor resembles the shape of a box with an open lid or top. The U-shape resistor may also comprise irregular bends and/or curves that may detract the resistor from its original U-shape, such as one of the ends of the resistor may bend and/or curve inward and/or outward to avoid making contact with another component on the integrated circuit.

Figure 14C:
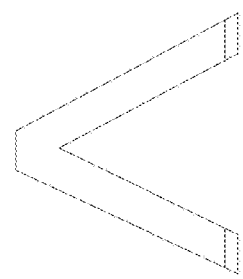
Figure 14D:
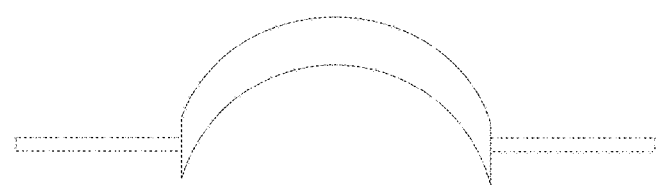

FIG. 14C is a V-shape resistor comprising two segments joined at a single vertex that resembles the letter V. The segments may vary in length or may be of equal length. The angle formed by the two segments may be of any value, whether forming an acute, obtuse, or right angle. Each segment may also comprise irregular bends and/or curves that may detract it from its original V-shape, such as one of the ends of the resistor may bend and/or curve inward and or outward to avoid making contact with a component on the integrated circuit. FIG. 14D is a crescent-shape resistor comprising or a single segment that is bent into a curve. The leads in this figure are illustrated only by way of example to reflect that the resistor may comprise leads protruding from both ends, or comprise the integrated surface-mount leads illustrated in the alternative figures of the set. Additionally, the single segment may be divided into multiple segments joined by vertices. Typically, in this situation, there would be one less vertex per amount of segments above one, e.g., six segments joined at five vertices to form a crescent/semicircular-shape resistor.

Figure 14E:
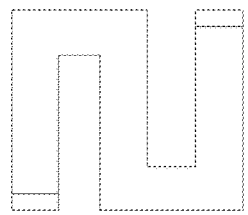
Figure 14F:
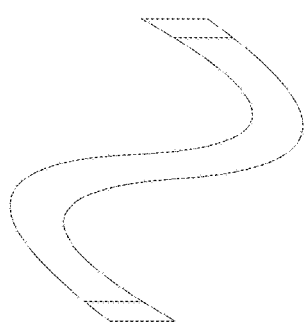
Figure 14G:
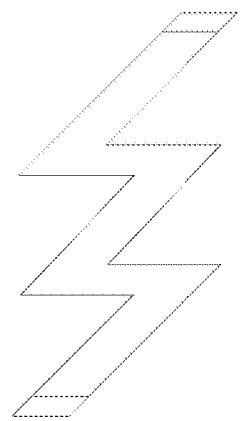

FIG. 14E is an S-shape resistor comprising five segments joined together at four vertices that resembles the letter S. The four vertices may form right angles (90-degrees). The resistor may be modified into any number of segments, with typically one less vertex per amount of segments. Additionally, the S-shape resistor may be smooth and does not comprise a vertex as shown in FIG. 14F. FIG. 14G is a zigzag-shape resistor, which is another configuration for the S-shape resistor. Contrary to the S-shape resistor, the zigzag-shape resistor's five segments form acute angles (>90-degrees) instead of the right angles seen in the S-shape resistor of FIG. 14E. However, its similarities are that it may be of any number of segments with one less vertex than the amount of segments present, and that a single vertex joins no more than two segments.

Figure 15:
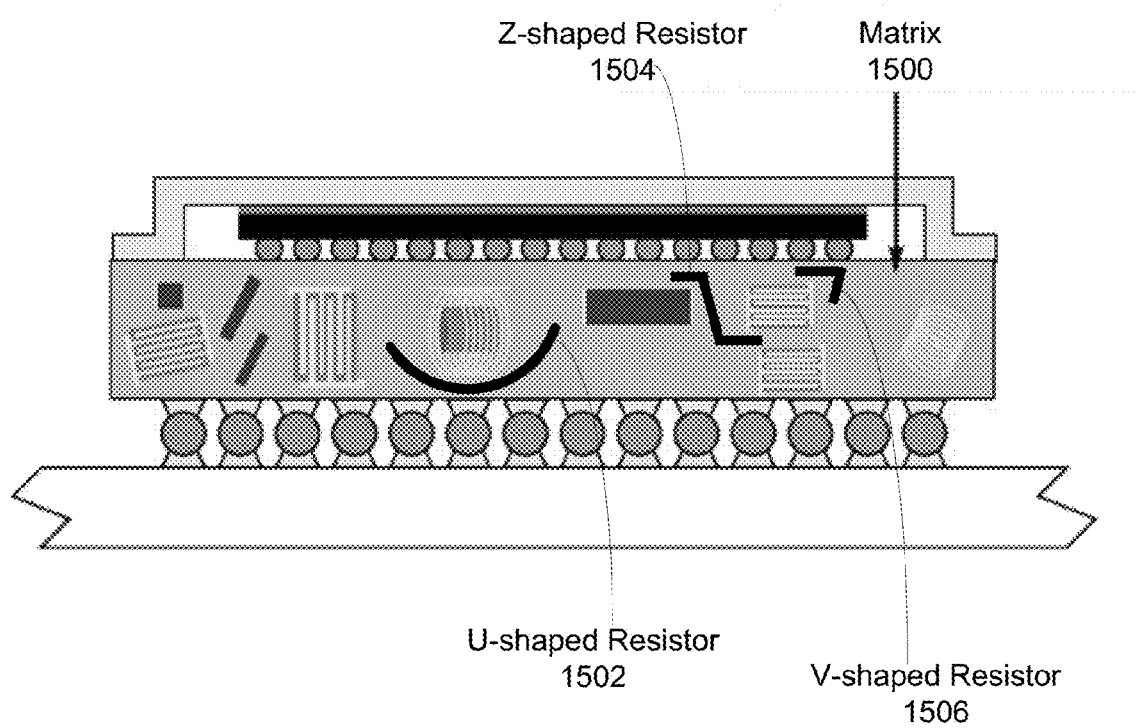
FIG. 15 is a schematic diagram of an integrated circuit comprising various shapes of resistors, according to at least one embodiment.

FIG. 15 is a schematic diagram of an integrated circuit comprising various shapes of resistors, according to at least one embodiment. Ceramic matric 1500 may comprise a U-shape resistor 1502 positioned below an inductor such that the U-shape resistor 1502's opening faces upward and the inductor is positioned within the cradle of the U-shape without making physical contact. A Z-shape resistor 1504 and a V-shape resistor 1506 may also be positioned in a manner to optimize space efficiency of the circuit while minimizing adverse effects. The present invention is not limited to these shapes (or sizes). Any geometry may be achieved through a method of the present invention.

Alternative configurations for resistor shape can be achieved by the printing technique of the present invention, drop-on-demand additive manufacturing. Individual components of an integrated circuit may be positioned on and within the circuit first while utilizing any remaining space to position resistors of different geometries, such as varying shape and size. The placement of the resistors after all of the other electrical components on the integrated circuit allows for optimized configurations of the integrated circuit, such as, e.g., minimizing (or maximizing) parasitic effects, without the need for significant consideration of the space remaining. In addition, each component may be encapsulated within a conductive layer to form a Faraday shield for minimizing parasitic effects.

Figure 16:
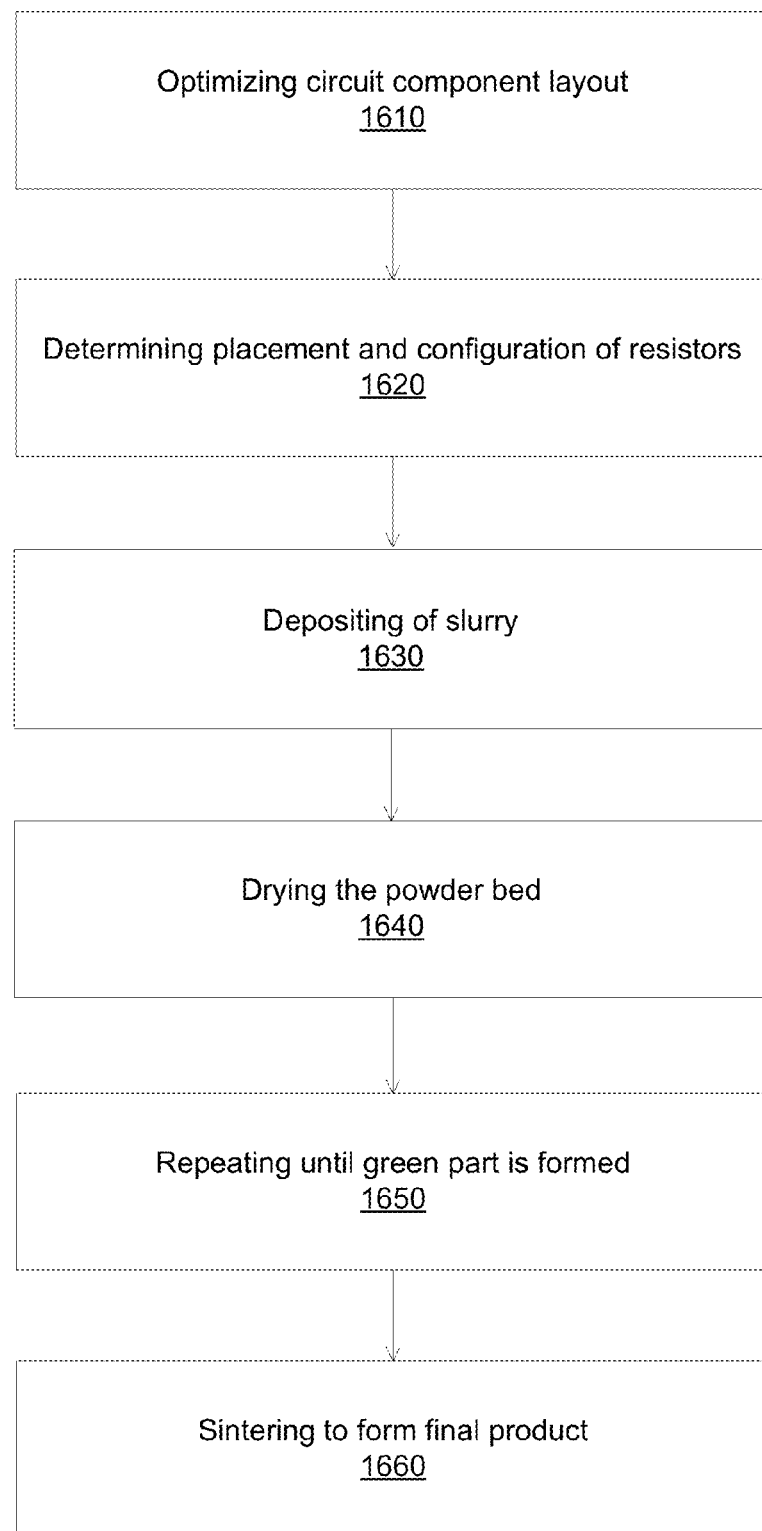
FIG. 16 is a flow diagram of a method of an additive printing process that may be implemented with one or more embodiments of the present invention.

FIG. 16 is a flow diagram of a method of an additive printing process that may be implemented with one or more embodiments of the present invention. Operation 1610 optimizes a circuit's component layout using CAD software. An algorithm of a computing device comprising a memory and a processor may be used to determine space, position and orientation of each individual component of an integrated chip during a planning phase prior to construction of the chip. Operation 1620 determines placement and configuration of resistors after all other components. The resistors may be optimized to comprise any shape and size to meet a predetermined specification, and may be positioned in such as manner to utilize remaining space of the ceramic package. Operation 1630 deposits layers of slurry comprising powder material onto a surface or on top of a powder bed, which then slip-casts to make a new layer. As the slurry deposits in each two dimensional layer, the printer may select insulator and/or conductor as the material type, in separate passes or as a combined pass. The slurry may be deposited in any suitable manner, including depositing in separate, distinct lines, e.g., by raster or vector scanning, by a plurality of simultaneous jets that coalesce before the liquid slip-casts into the bed, or by individual drops. The deposit of slurry drops may be individually controlled, thereby generating a regular surface for each layer. Operation 1640 dries any liquid from the powder bed, e.g., infrared flash-dry, after deposition of each layer. Operation 1650 repeats operations 1630 and 1640 until a green part is formed. Operation 1660 sinters the green part to form a final product. Sintering is a solid-state diffusion process that may be enhanced by increasing the surface area to volume ratio of the powder in any green part that is subsequently sintered.

In at least one embodiment, the present invention discloses a system and a method to improve an inductor through 3D Printing. An inductor usually consists of a coil of conducting material, typically insulated copper wire, wrapped around a core made of plastic or ferromagnetic material. The high permeability of the ferromagnetic core increases the magnetic field, therefore increasing the inductance. Most inductors are large, which prevents them from being integrated in semiconductor chips. Small inductors can be printed on a chip with photolithography using the same processes that make transistors. They are typically made in the form of a flat spiral with the conductive material required by the chip. The conductive material can be combined with ferromagnetic material to increase the inductance per unit area.

With 3D printing, there is no restriction to flat geometries, so a higher inductance can be achieved (per unit volume instead of per unit area). For instance, it is possible to print a helical coil, or a toroidal coil, and the core could be omitted (when linear behavior is desired) or 3D printed with a ferrite for much higher inductance. To reduce parasitic capacitance in an inductor, geometric techniques such as "basket-weave coils" or "spider web coils" have been traditionally used, at increased manufacturing cost. With 3D printed inductors, there is no additional manufacturing cost for the use of sophisticated geometries.

In at least one embodiment, the present invention discloses a system and a method to improve a capacitor. MLCCs made of alternating layers of ferroelectric (high-κ) dielectric and conductor can be embedded in the low-κ dielectric matrix material. The use of low-κ material between capacitors, in combination with grounded conductive Faraday cages between components as needed, means that separate capacitors can thus be placed in close proximity without creating parasitic effects.

A ceramic slurry can be made with barium titanate (BaTiO$_3$) exhibits the ferroelectric effect, giving permittivities thousands of times that of a vacuum; it therefore can be used to make high-performance, high-density capacitors. A slurry made with alumina, on the other hand, has low permittivity and therefore is less likely to create unwanted capacitance between nearby conductors. As an example, MLCCs have been built with doped barium titanate materials that exhibit permittivity as high as 6500; alumina, on the other hand, has a permittivity around 10, almost three orders of magnitude lower.

Figure 17:
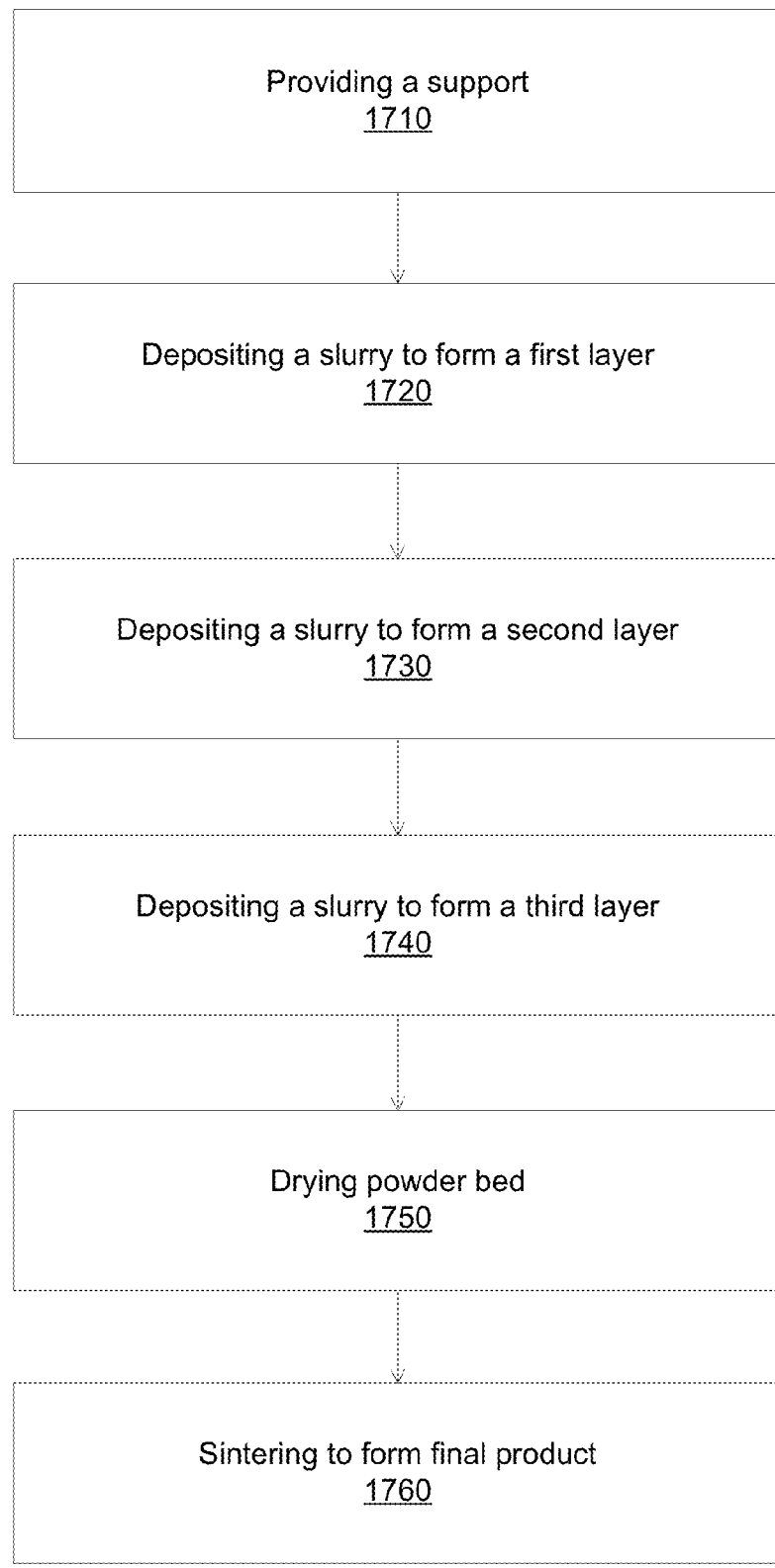
FIG. 17 is a flow diagram of a method of additive manufacturing that may be implemented in one or more embodiments of the present invention.

FIG. 17 is a flow diagram of a method of additive manufacturing that may be implemented in one or more embodiments of the present invention. Operation 1710 provides a support over a selected area. Operation 1720 deposits liquid slurry to form a first layer comprising conductive metal, such as, e.g., copper, nickel, silver, palladium, gold, and/or platinum. The slurry may be deposited as continuous parallel streams, or as individually controlled droplets, thereby generating a regular surface for each layer. Operation 1730 deposits liquid slurry to form a second layer comprising dielectric or ceramic material, such as, e.g., barium titanate. Operation 1740 deposits liquid slurry to form a third layer. The third layer may comprise the same material as the first layer. In some embodiments, operation 1720 and operation 1730 sequentially repeat until a predetermined amount of alternating layers of conductor and dielectric material is achieved. Operation 1750 dries the powder bed by flash drying, e.g., infrared heating. Operation 1760 sinters the layers to form a final product.

Figure 18:
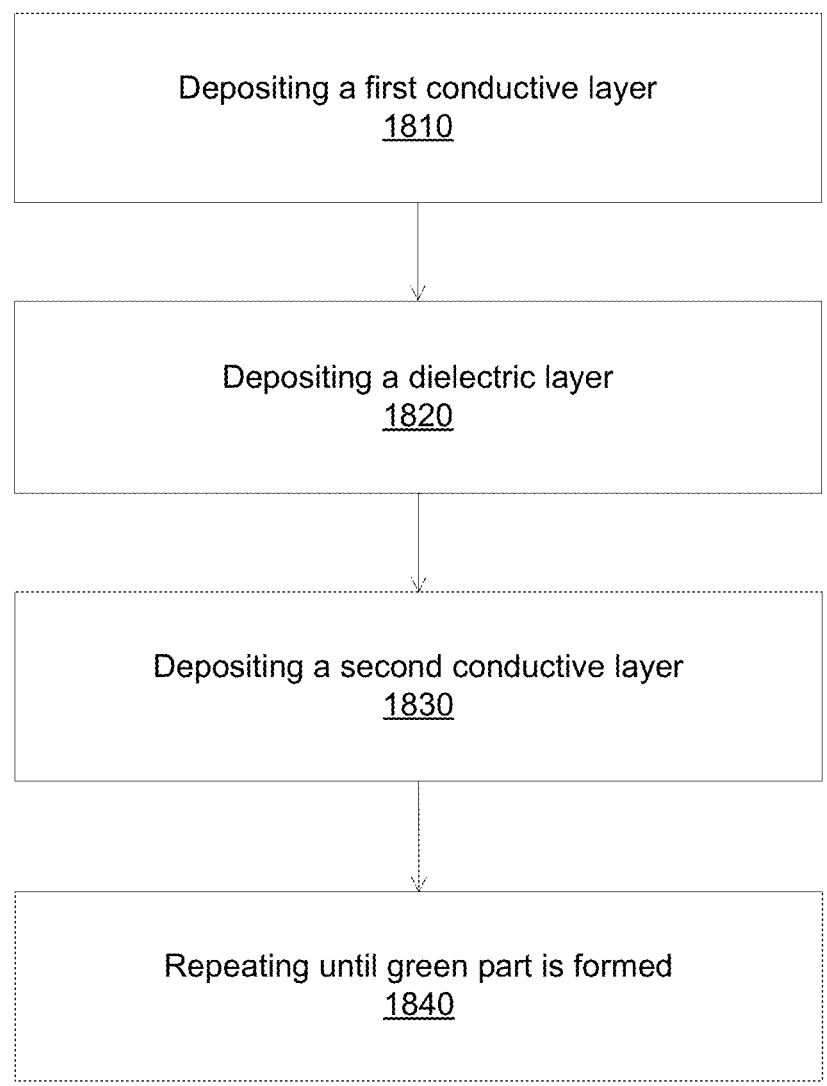
FIG. 18 is a flow diagram of another method of additive manufacturing that may be implemented in one or more embodiments of the present invention.

FIG. 18 is a flow diagram of another method of additive manufacturing that may be implemented in one or more embodiments of the present invention. Operation 1810 deposits a first conductive layer onto a surface. Operation 1820 deposits a dielectric layer on a top surface of the first conductive layer. Operation 1830 deposits a second conductive layer onto a top surface of the dielectric layer. Optionally, operation 1840 repeats operation 1820 and operation 1830 successively and sequentially such that the conductive layers and the dielectric layers alternate, and the conductive layers are disposed at both the bottom layer and the top layer, although in practice, the MLCCs may be manufactured with dielectric layers disposed at both the bottom layer and the top layer. The aforementioned steps may produce a ceramic capacitor comprising a first conductive layer formed on a surface of a dielectric layer, and a second conductive layer formed on the opposing surface of the dielectric layer.

In at least one embodiment, the present invention discloses a system and a method of an adjustable multi-property device. In general, each type of passive component has some amount of behavior like that of the other two. Resistors have some inductance and capacitance; inductors have resistance and capacitance; capacitors have some resistance and inductance. They are not "ideal" devices. When circuits are designed as idealized passive components in series and parallel, 3D printing enables creation of devices that can provide a single device that has the same function as a combination of ideal devices on a circuit diagram, thereby increasing functionality per unit volume and unit weight and decreasing cost through reduction of material needed for manufacture.

An RLC circuit is an electrical circuit comprising a resistor, an inductor, and a capacitor, connected in series or in parallel. The RLC part of the name is due to those letters being the usual electrical symbols for resistance, inductance and capacitance respectively. Some resistance is unavoidable in real circuits, even if a resistor is not specifically included as a component. A pure LC circuit is an ideal that exists only in theory.

Figure 19:
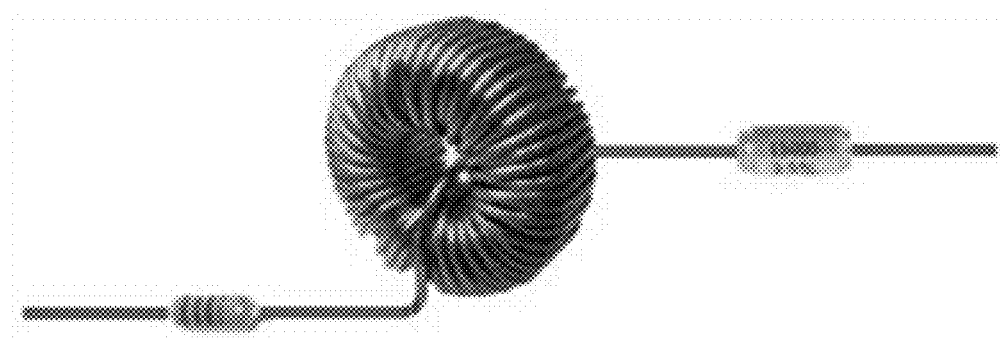
FIG. 19 is an example RLC circuit comprising a resistor, an inductor, and a capacitor, according to at least one embodiment.

FIG. 19 is an example RLC circuit comprising a resistor, an inductor, and a capacitor, according to at least one embodiment. There are many applications for this circuit, such as for tuning radio receivers or television sets, where they are used to select a narrow range of frequencies from the ambient radio waves. An RLC circuit can be used as a band-pass filter, band-stop filter, low-pass filter or high-pass filter. The tuning application, for instance, is an example of band-pass filtering. The three circuit elements can be combined in a number of different topologies. All three elements in series or all three elements in parallel are the simplest in concept and the most straightforward to analyze; however, other arrangements may be used.

The present invention discloses a system and a method of artificially combining RLC properties in a single component. 3D Printing enables creation of a single device that comprise the same properties as a combination of ideal devices on a circuit diagram, thereby increasing functionality per unit volume and unit weight and decreasing cost through reduction of material needed for manufacture. The properties may be adjustable and based on the application that it is intended. There are two approaches that can create such "in-between" component properties: intermediate shapes and intermediate ink or aerosol mixtures.

Figure 20:
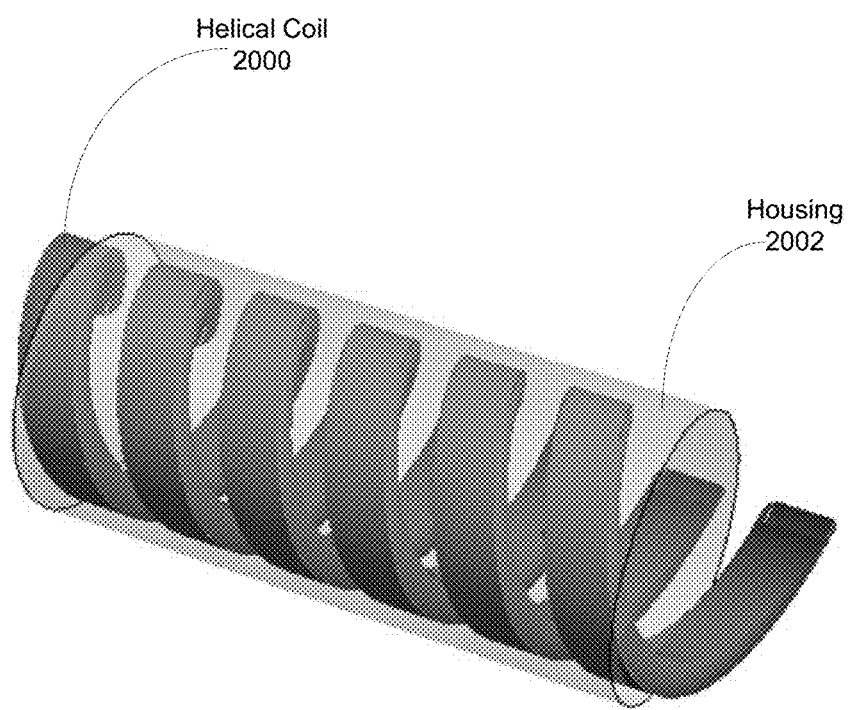
FIG. 20 illustrates a 3D-printable component with both inductance and capacitance through an intermediate shape and ink, according to at one embodiment.

FIG. 20 illustrates a 3D-printable component with both inductance and capacitance through an intermediate shape and ink, according to at one embodiment. An intermediate shape may be a shape comprising a combination of shapes typically associated with particular electrical components, such as, e.g., a combination of a helical coil shape of an inductor and a cylindrical shape housing of a capacitor. An intermediate ink may be a mixture or gradient of conductor material and insulator material may be used to achieve a predetermined property or specification of the component.

Helical coil 1800 may comprise conductive material encased in cylindrical housing 1802 comprising high-κ dielectric, such as, e.g., barium titanate. As shown, this is a four-electrode device, with different inductance-capacitor properties depending on which electrode pair is used as the component electrodes; however, any number of electrodes can be employed, such as, e.g., two or six or eight.

In order to appreciate how intermediate ink could be used, consider an ideal MLCC, with layers of perfect conductor separated by layers of perfect insulator. Actual MLCCs have a small amount of resistance in charging or discharging, since the conductor is not ideal. This is called Equivalent Series Resistance (ESR) because it is like connecting a resistor in series to the capacitor. Conversely, actual MLCC insulators do not have infinite resistance; there is always some current leakage, equivalent to Equivalent Parallel Resistance (EPR). Both kinds of resistance are useful in circuits, and presently circuits simply combine a near-ideal capacitor with a near-ideal resistor in either parallel or series. But 3D printing allows any combination of ESR and EPR with the capacitor for almost the same device volume as the capacitor alone. Adding resistor ink (for example, nanoscale carbon in suspension) to the conductor ink (for example, silver nanoparticles) will increase ESR. Adding resistor ink to the insulator ink (for example, barium titanate) will decrease EPR. In other words, a varying gradient of conductor material and insulator material may be used to achieve a predetermined property or specification of the component. A similar approach applies to inductors.

Figure 21:
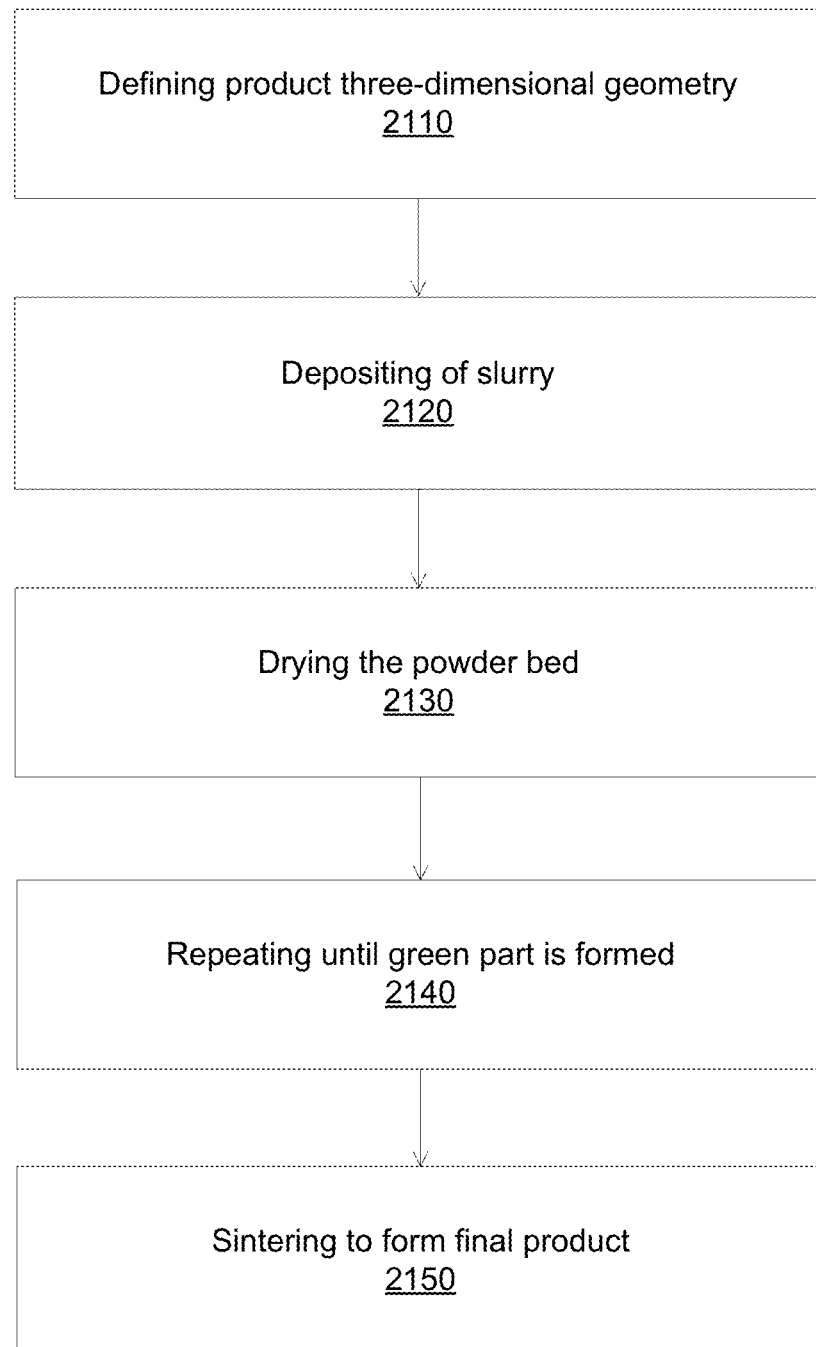
FIG. 21 is a flow diagram of a method of an additive printing process that may be implemented with one or more embodiments of the present invention.

FIG. 21 is a flow diagram of a method of an additive printing process that may be implemented with one or more embodiments of the present invention. Operation 2110 defines a final product's three-dimensional geometry using CAD software. Operation 2120 deposits layers of slurry comprising powder material onto a surface or on top of a powder bed, which then slip-casts to make a new layer. As the slurry deposits in each two dimensional layer, the printer may select insulator and/or conductor as the material type, in separate passes or as a combined pass.

A capacitor, a resistor, an inductor, and/or a multi-property device may be printed into a ceramic package of an integrated circuit. Depending on the shape and configuration of the components, each layer will print portions of the capacitor, resistor and/or inductor using materials such as, e.g., carbon and ferrite pastes, conductive ink, ceramic and metal slurry. Intermediate ink such as a gradient mixture of conductor material and insulator materials may be used to control, adjust, and ultimately achieve a desired property or specification of the component. For example, adding resistor ink, e.g., nanoscale carbon in suspension, to the conductor ink, e.g., silver nanoparticles, will increase ESR. Adding resistor ink to the insulator ink, e.g., barium titanate, will decrease EPR. In other words, a varying gradient of conductor material and insulator material may be used to achieve a predetermined property or specification for the component. In addition, a conductive plane may be printed between adjacent components, or a conductive cage may be printed around each individual components. The conductive plane and/or the conductive cage may be grounded.

The slurry may be deposited in any suitable manner, including depositing in separate, distinct lines, e.g., by raster or vector scanning, by a plurality of simultaneous jets that coalesce before the liquid slip-casts into the bed, or by individual drops. The deposit of slurry drops may be individually controlled, thereby generating a regular surface for each layer. Operation 2130 dries any liquid from the powder bed, e.g., infrared flash-dry, after deposition of each layer. Operation 2140 repeats operations 2120 and 2130 until a green part is formed. Operation 2150 sinters the green part to form a final product. Sintering is a solid-state diffusion process that may be enhanced by increasing the surface area to volume ratio of the powder in any green part that is subsequently sintered.

Figure 22:
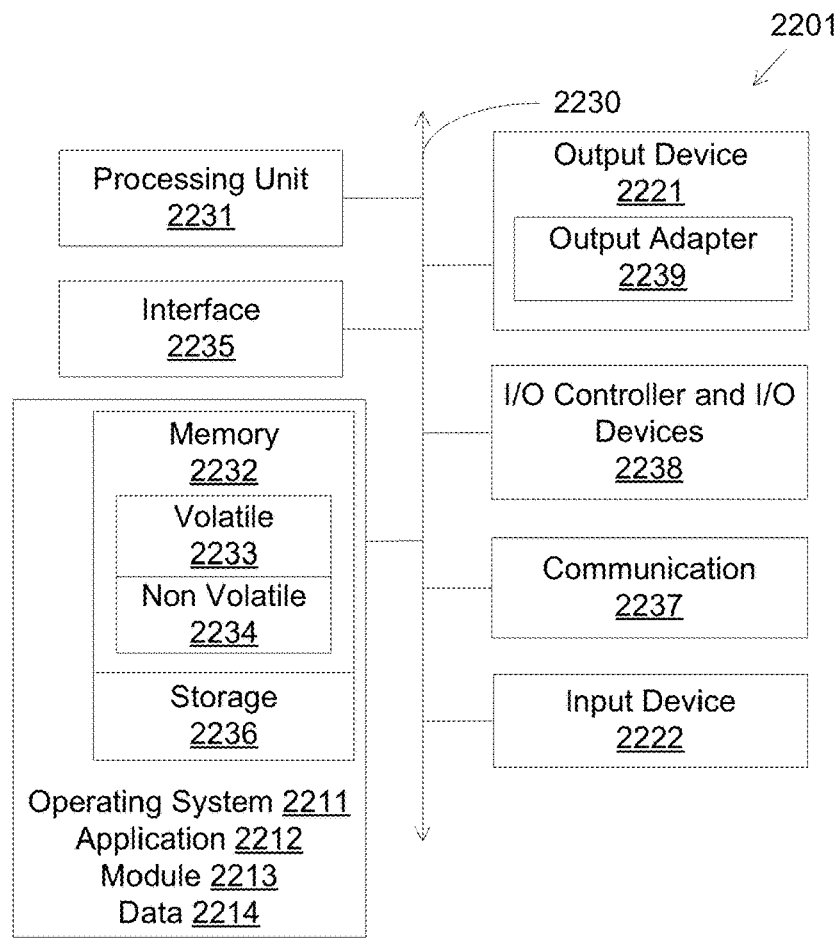
FIG. 22 illustrates a computing environment, according to some embodiments.

FIG. 22 illustrates a computing environment, according to some embodiments. An exemplary environment for implementing various aspects of the invention includes a computer 2201, comprising a processing unit 2231, a system memory 2232, and a system bus 2230. The processing unit 2231 may be any of various available processors, such as single microprocessor, dual microprocessors or other multiprocessor architectures. The system bus 1930 may be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 2232 may include volatile memory 2233 and nonvolatile memory 2234. Nonvolatile memory 2234 may include read only memory (ROM), programmable ROM (PROM), electrically programmable ROM (EPROM), electrically erasable ROM (EEPROM), or flash memory. Volatile memory 2233, may include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 2201 also includes storage media 2236, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 2235 may be used to facilitate connection.

The computer system 2201 further may include software to operate in an environment, such as an operating system 2211, system applications 2212, program modules 2213 and program data 2214, which are stored either in system memory 2232 or on disk storage 2236. Various operating systems or combinations of operating systems may be used.

Input devices 2222 may be used to enter commands or data, and may include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 2238. Interface ports 2238 may include a serial port, a parallel port, a game port, a universal serial bus (USB), and a 1394 bus. The interface ports 2238 may also accommodate output devices 2221. For example, a USB port may be used to provide input to computer 2201 and to output information from computer 2201 to an output device 2221. Output adapter 2239, such as video or sound cards, is provided to connect to some output devices such as monitors, speakers, and printers.

Computer 2201 may operate in a networked environment with remote computers. The remote computers may comprise a memory storage device, and may be a personal computer, a server, a router, a network PC, a workstation, a microprocessor based appliance, a peer device or other common network node and the like, and typically includes many or all of the elements described relative to computer 2201. Remote computers may be connected to computer 1901 through a network interface and communication connection 2237, with wire or wireless connections. A network interface may be communication networks such as local-area networks (LAN), wide area networks (WAN) or wireless connection networks. LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Figure 23:
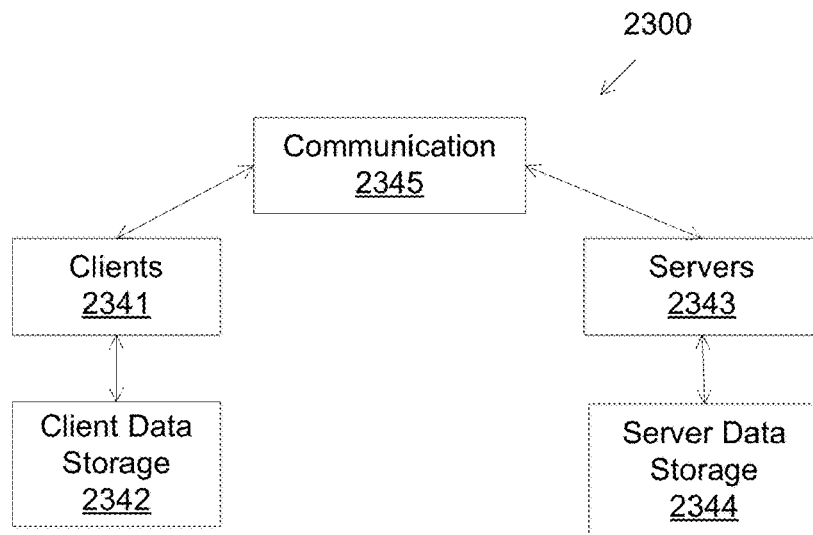
FIG. 23 is a schematic block diagram of a sample computing environment with which the present invention may interact.

FIG. 23 is a schematic block diagram of a sample computing environment 2300 with which the present invention may interact. The system 2340 includes a plurality of client systems 2341. The system also includes a plurality of servers 2343. The servers 2343 may be used to employ the present invention. The system includes a communication network 2045 to facilitate communications between the clients 2341 and the servers 2343. Client data storage 2342, connected to client system 2341, may store information locally. Similarly, the server 2343 may include server data storages 2344.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims. It may be appreciated that the various systems, methods, and apparatus disclosed herein may be embodied in a machine-readable medium and/or a machine accessible medium, and/or may be performed in any order. The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. An integrated circuit, comprising:
a circuit die;
a lid covering a top surface of the circuit die;
a ceramic matrix packaging, and
wherein the ceramic matrix packaging comprises at least one of an embedded resistor, capacitor, inductor, and multi-property device disposed within the ceramic matrix packaging,
wherein formation of the integrated circuit is specified by successive additions of a plurality of voxels of material through a deposit of droplets, and
wherein the at least one of an embedded resistor, capacitor, inductor, and multi-property device is oriented at an angle to minimize a parasitic effect.

2. The integrated circuit of claim 1, further comprising:
wherein the at least one of an embedded resistor, capacitor, inductor, and multi-property device is oriented at an angle to optimize space usage of the ceramic matrix.

3. The integrated circuit of claim 1, further comprising:
wherein the multi-property device comprises at least one helical coil encased in a cylindrical housing, and
wherein the cylindrical housing comprises barium titanate.

4. The integrated circuit of claim 3, further comprising:
wherein the multi-property device comprises four electrodes, and
wherein inductance-capacitance properties is based on electrode pairs.

5. The integrated circuit of claim 1, further comprising:
wherein capacitance, resistance, and inductance of the multi-property device are adjustable based on at least one of an intermediate shape and an intermediate ink.

6. The integrated circuit of claim 1, further comprising:
wherein the resistor comprises a Z-shape, a U-shape, a S-shape, a smooth S-shape, or a crescent-shape.

7. The integrated circuit of claim 1, further comprising:
wherein a core of the inductor comprises ferromagnetic material.

8. The integrated circuit of claim 1, further comprising:
wherein the inductor comprises a helical coil, and
wherein the inductor does not comprise a core.

9. The integrated circuit of claim 1, further comprising:
wherein the ceramic matrix packaging comprises at least one air gap disposed between a pair of the at least one of an embedded resistor, capacitor, inductor, and multi-property device.

10. An integrated circuit, comprising:
a circuit die;
a ceramic matrix packaging,
wherein the ceramic matrix packaging comprises at least one of an embedded resistor, capacitor, inductor, and multi-property device disposed within the ceramic matrix packaging; and
a conductive cage encapsulating the at least one of an embedded resistor, capacitor, inductor, and multi-property device
wherein the conductive cage comprises a general shape of the at least one of an embedded resistor, capacitor, inductor, and multi-property device to which it encapsulates,
wherein the conductive cage is larger in size than the at least one of an embedded resistor, capacitor, inductor, and multi-property device to which it encapsulates,
wherein the conductive cage is one voxel thick, and
wherein a distance between a pair of the at least one of an embedded resistor, capacitor, inductor, and multi-property device is less than 10 microns.

11. The integrated circuit of claim 10, further comprising:
wherein the conductive cage comprises two openings, and
wherein the openings are larger in diameter than electrodes of the at least one of an embedded resistor, capacitor, inductor, and multi-property device.

12. The integrated circuit of claim 10, further comprising:
wherein the conductive cage is grounded to the lid or a circuit board.

13. An integrated circuit, comprising:
a circuit die;
a lid covering a top surface of the circuit die;
a ceramic matrix packaging,
wherein the ceramic matrix packaging comprises at least one of an embedded resistor, a capacitor, an inductor, and a multi-property device disposed within the ceramic matrix packaging;
a conductive plane disposed between the at least one of an embedded resistor, capacitor, inductor, and multi-property device to shield magnetic flux; and
a circuit board, and
wherein the conductive plane is one voxel thick.

14. The integrated circuit of claim 13, further comprising:
wherein the conductive plane is grounded to the lid or the circuit board.

15. An integrated circuit, comprising:
a circuit die;
a lid covering a top surface of the circuit die;
a ceramic matrix packaging, and
wherein the ceramic matrix packaging comprises at least one of an embedded resistor, capacitor, inductor, and multi-property device disposed within the ceramic matrix packaging, and
wherein the integrated circuit is formed as a single structure,
wherein the at least one embedded resistor capacitor, inductor, and multi-property device is sintered to the ceramic matrix packaging.

* * * * *